(12) United States Patent
Liu

(10) Patent No.: US 11,729,978 B2
(45) Date of Patent: *Aug. 15, 2023

(54) CHANNEL HOLE AND BITLINE ARCHITECTURE AND METHOD TO IMPROVE PAGE OR BLOCK SIZE AND PERFORMANCE OF 3D NAND

(71) Applicant: Yangtze Memory Technologies Co., Ltd., Hubei (CN)

(72) Inventor: Jun Liu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 39 days.

This patent is subject to a terminal disclaimer.

(21) Appl. No.: 17/509,195

(22) Filed: Oct. 25, 2021

(65) Prior Publication Data
US 2022/0045100 A1 Feb. 10, 2022

Related U.S. Application Data

(60) Division of application No. 16/419,825, filed on May 22, 2019, now Pat. No. 11,296,107, which is a
(Continued)

(51) Int. Cl.
*H01L 29/40* (2006.01)
*H01L 29/10* (2006.01)
(Continued)

(52) U.S. Cl.
CPC ......... *H10B 43/27* (2023.02); *H01L 23/5226* (2013.01); *H01L 29/1033* (2013.01);
(Continued)

(58) Field of Classification Search
CPC ............ H01L 29/1033; H01L 29/4234; H01L 29/40117; H01L 27/11565; H01L 27/1157;
(Continued)

(56) References Cited

U.S. PATENT DOCUMENTS 9,397,111 B1 7/2016 Chowdhury et al.
9,899,399 B2 2/2018 Ogawa et al.
(Continued)

FOREIGN PATENT DOCUMENTS

CN 103226972 A 7/2013
CN 106033791 A 10/2016
(Continued)

OTHER PUBLICATIONS

Extended European Search Report and Search Opinion for EP Application No. 19916293.4, European Patent Office, Munich, Germany, dated Apr. 19, 2022, 8 pages.
(Continued)

*Primary Examiner* — Monica D Harrison
(74) *Attorney, Agent, or Firm* — Sterne, Kessler, Goldstein & Fox P.L.L.C.

(57) ABSTRACT

Embodiments of a memory finger structure and architecture for a three-dimensional memory device and fabrication method thereof are disclosed. The method includes forming an alternating layer stack, forming a plurality of slit structures, forming a plurality of conductor/dielectric layer pairs, forming a first column of vertical memory strings, forming a second column of vertical memory strings, and forming a plurality of bitlines. The plurality of slit structures each extend vertically through the alternating layer stack and laterally along a wordline direction to divide the alternating layer stack into at least one memory finger. The vertical memory strings in the first column are displaced relative to each other along the wordline direction. The vertical memory strings in the second column are displaced relative to each other along the wordline direction. Each bitline is connected to an individual vertical memory string in the first and second columns.

20 Claims, 12 Drawing Sheets

Related U.S. Application Data continuation of application No. PCT/CN2019/075359, filed on Feb. 18, 2019.

(51) Int. Cl.

| | | |
|---|---|---|
| *H10B 43/27* | (2023.01) | |
| *H01L 21/28* | (2006.01) | |
| *H01L 23/522* | (2006.01) | |
| *H01L 29/423* | (2006.01) | |
| *H10B 43/10* | (2023.01) | |
| *H10B 43/35* | (2023.01) | |
| *H10B 43/40* | (2023.01) | |

(52) U.S. Cl.
CPC .... *H01L 29/40117* (2019.08); *H01L 29/4234* (2013.01); *H10B 43/10* (2023.02); *H10B 43/35* (2023.02); *H10B 43/40* (2023.02)

(58) Field of Classification Search
CPC ......... H01L 27/11573; H01L 27/11582; H01L 23/5256
USPC ....................................................... 257/324
See application file for complete search history.

(56) References Cited

U.S. PATENT DOCUMENTS

| | | | |
|---|---|---|---|
| 9,941,333 | B2 | 4/2018 | Jeong et al. |
| 10,373,969 | B2 | 8/2019 | Zhang et al. |
| 11,296,107 | B2 * | 4/2022 | Liu ................... H01L 27/11519 |
| 2011/0235421 | A1 | 9/2011 | Itagaki et al. |
| 2013/0003433 | A1 | 1/2013 | Hishida et al. |
| 2013/0100738 | A1 | 4/2013 | Choi |
| 2015/0206898 | A1 | 7/2015 | Chen |
| 2017/0200733 | A1 | 7/2017 | Lee |
| 2018/0108673 | A1 | 4/2018 | Lee |
| 2018/0233513 | A1 | 8/2018 | Zhang et al. |
| 2019/0057974 | A1 | 2/2019 | Lu et al. |
| 2020/0058486 | A1 | 2/2020 | Dai et al. |

FOREIGN PATENT DOCUMENTS

| | | |
|---|---|---|
| CN | 107068687 A | 8/2017 |
| CN | 108666323 A | 10/2018 |
| CN | 109037230 A | 12/2018 |
| CN | 109075169 A | 12/2018 |
| JP | 2011198435 A | 10/2011 |
| JP | 2013012553 A | 1/2013 |
| JP | 2018536277 A | 12/2018 |
| JP | 2018537842 A | 12/2018 |
| TW | 201628164 A | 8/2016 |
| TW | 201740584 A | 11/2017 |
| TW | 201834221 A | 9/2018 |
| WO | 2018161836 A1 | 9/2018 |

OTHER PUBLICATIONS

Office Action for Taiwanese Application No. 108112225, Taiwanese Patent Office, dated Jul. 3, 2020, 8 pages.
International Search Report and Written Opinion for International Application No. PCT/CN2019/075359, Chinese Patent Office, Beijing, dated Nov. 22, 2019, 8 pages.
Search Report for Chinese Application No. 2019800003477.7, Chinese Patent Office, dated Oct. 24, 2019, 5 pages.
Office Action for Chinese Application No. 2019800003477.7, Chinese Patent Office, dated Nov. 1, 2019, 21 pages.
Office Action for Taiwanese Application No. 108112225, Taiwanese Patent Office, dated Jul. 14, 2022.
Office Action for Japanese Application No. 2021-530965, Japanese Patent Office, dated Aug. 1, 2022, 8 pages.
Office Action for European Application No. 19916293.4, European Patent Office, dated Jan. 18, 2023, 4 pages.
Office Action for Japanese Application No. 2021-530965, Japanese Patent Office, dated Jan. 23, 2023, 8 pages.

* cited by examiner

CHANNEL HOLE AND BITLINE ARCHITECTURE AND METHOD TO IMPROVE PAGE OR BLOCK SIZE AND PERFORMANCE OF 3D NAND

CROSS REFERENCES TO RELATED APPLICATIONS

This application is a divisional of U.S. application Ser. No. 16/419,825, filed May 22, 2019, which is a continuation of International Application No. PCT/CN2019/075359, filed Feb. 18, 2019, which are hereby incorporated herein in their entireties by reference.

BACKGROUND

Embodiments of the present disclosure relate to three-dimensional (3D) memory devices and fabrication methods thereof. More specifically, embodiments of the present disclosure relate to charge trap flash (CTF) non-volatile memory devices, for example, 3D NAND devices.

Planar memory cells are scaled to smaller sizes by improving process technology, circuit design, programming algorithms, and fabrication processes. However, as feature sizes of a memory cell approach a lower limit, planar processes and fabrication techniques become challenging and costly. As a result, memory density for planar memory cells approaches an upper limit. 3D memory architecture can address the density limitation in planar memory cells. 3D memory architecture includes a memory array and peripheral devices for controlling signals to and from the memory array.

A 3D memory device includes one or more memory planes or memory stacks. Memory planes include one or more memory blocks or memory arrays. Memory blocks include one or more addressable memory fingers. Memory fingers include two or more addressable memory pages. Generally, each memory finger requires two or more read operations to retrieve data from all memory cells in each memory finger. Memory finger and memory page size is limited by the bitline (BL) pitch. A larger memory finger size leads to longer wordlines (WL) and larger time constants, which leads to slower read times and longer total programming times.

BRIEF SUMMARY

Embodiments of memory finger structures and architectures for 3D memory devices and fabrication methods thereof are disclosed herein.

Disclosed is a memory finger structure for a 3D memory device. In some embodiments, the 3D memory device includes an alternating layer stack disposed on a first substrate. The alternating layer stack includes a plurality of conductor/dielectric layer pairs. The 3D memory device further includes a first column of vertical memory strings extending through the alternating layer stack and a first plurality of bitlines displaced along a first direction and extending along a second direction. The first column of vertical memory strings is disposed at a first angle relative to the second direction. Each of the first plurality of bitlines is connected to an individual vertical memory string in the first column. In some embodiments, the 3D memory device is a 3D NAND memory device.

In some embodiments, the 3D memory device further includes a second column of vertical memory strings extending through the alternating layer stack and a second plurality of bitlines displaced along the first direction and extending along the second direction. The second column of vertical memory strings is disposed at a second angle relative to the second direction. Each of the second plurality of bitlines is connected to an individual vertical memory string in the second column.

In some embodiments, the first and second columns define a channel hole pitch along the first direction.

In some embodiments, the first plurality of bitlines and the second plurality of bitlines define a bitline pitch.

In some embodiments, the channel hole pitch is about eight to about twelve times the bitline pitch. In some embodiments, the channel hole pitch is about eight times the bitline pitch. In some embodiments, the channel hole pitch is about ten times the bitline pitch. In some embodiments, the channel hole pitch is about twelve times the bitline pitch. In some embodiments, the bitline pitch is 0.125 times the channel hole pitch. In some embodiments, the bitline pitch is 0.1 times the channel hole pitch. In some embodiments, the bitline pitch is 0.083 times the channel hole pitch.

In some embodiments, the first plurality of bitlines includes about four to about six bitlines and the first column includes about four to about six corresponding vertical memory strings. In some embodiments, the second plurality of bitlines includes about four to about six bitlines and the second column includes about four to about six corresponding vertical memory strings. In some embodiments, the first plurality of bitlines includes four bitlines and the first column includes four corresponding vertical memory strings, and the second plurality of bitlines includes four bitlines and the second column includes four corresponding vertical memory strings. In some embodiments, the first plurality of bitlines includes five bitlines and the first column includes five corresponding vertical memory strings, and the second plurality of bitlines includes five bitlines and the second column includes five corresponding vertical memory strings. In some embodiments, the first plurality of bitlines includes six bitlines and the first column includes six corresponding vertical memory strings, and the second plurality of bitlines includes six bitlines and the second column includes six corresponding vertical memory strings.

In some embodiments, the first and second angles are equal. In some embodiments, the first and second angles are about 5 to about 30 degrees.

In some embodiments, a number of the plurality of conductor/dielectric layer pairs is at least 32.

In some embodiments, the 3D memory device further includes a plurality of slit structures each extending vertically through the alternating layer stack and laterally along a wordline direction to divide the alternating layer stack into a plurality of memory fingers.

In some embodiments, the 3D memory device further includes a continuous top select gate along the second direction and connected to the first column of vertical memory strings.

Another aspect of the present disclosure provides a method for forming a memory finger for a 3D memory device. In some embodiments, the method includes forming, on a first substrate, an alternating layer stack. The method further includes forming a plurality of slit structures each extending vertically through the alternating layer stack and laterally along a wordline direction to divide the alternating layer stack into at least one memory finger. The method further includes forming, in the alternating layer stack, a plurality of conductor/dielectric layer pairs. The method further includes forming a first column of vertical memory strings extending through the alternating layer stack in the at least one memory finger. The vertical memory strings in the first column are displaced relative to each other along the wordline direction. The method further includes forming a second column of vertical memory strings extending through the alternating layer stack in the at least one memory finger. The vertical memory strings in the second column are displaced relative to each other along the wordline direction. The method further includes forming a plurality of bitlines displaced along the wordline direction and extending along a bitline direction in the at least one memory finger, wherein each bitline is connected to an individual vertical memory strings in the first and second columns. In some embodiments, the 3D memory device is a 3D NAND memory device. In some embodiments, forming the first and second columns can be done simultaneously.

In some embodiments, forming the plurality of bitlines is by quadruple patterning.

In some embodiments, the vertical memory strings of the first column are displaced evenly relative to each other along the wordline direction. In some embodiments, the vertical memory strings of the second column are displaced evenly relative to each other along the wordline direction. In some embodiments, the vertical memory strings of the first column are displaced relative to each other by a relative distance of about 1 nm to about 10 nm. In some embodiments, the vertical memory strings of the second column are displaced relative to each other by a relative distance of about 1 nm to about 10 nm.

In some embodiments, the method further includes a continuous top select gate along the bitline direction and connected to the first and second columns of vertical memory strings in the at least one memory finger.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
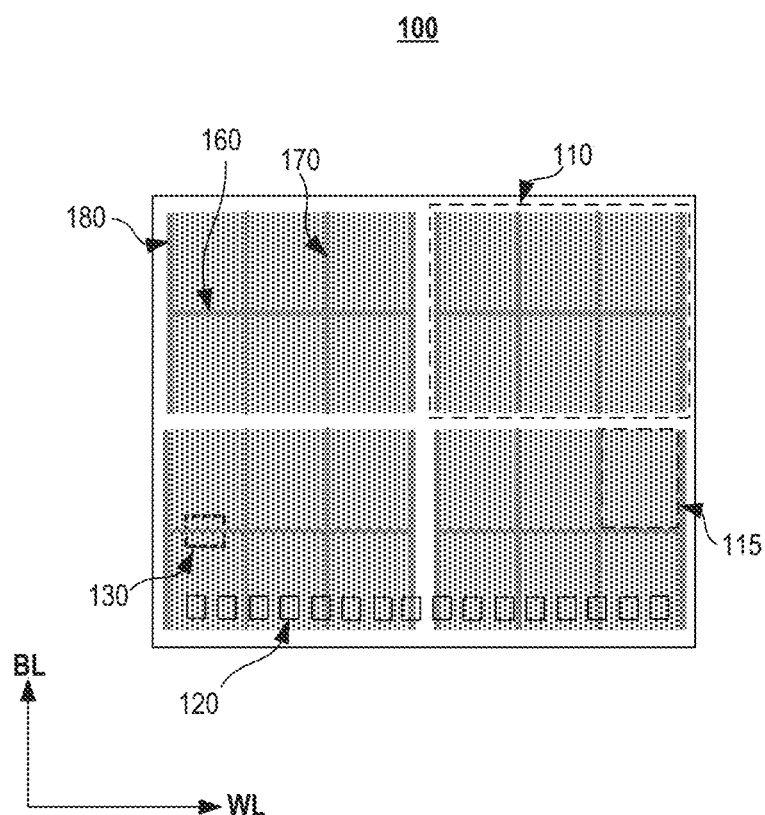
FIG. 1 illustrates a schematic diagram of an exemplary 3D memory device in a plan view, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only has the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a 3D memory device with through array contact (TAC) structures for a memory array (also referred to herein as an "array device"). The TAC structures allow contacts between the memory and various peripheral circuits and/or peripheral devices (e.g., page buffers, latches, decoders, etc.) to be fabricated in a limited number of steps (e.g., in a single step or in two steps), thereby reducing the process complexity and manufacturing cost. The disclosed TACs are formed through a stack of alternating dielectric layers, which can be more easily etched to form through holes therein compared with a stack of alternating conductor and dielectric layers.

The TACs can provide vertical interconnects between the stacked array device and peripheral device (e.g., for power bus and metal routing), thereby reducing metal levels and shrinking die size. In some embodiments, the TACs can be interconnected with various lines in a top conductive layer and/or a bottom conductive layer, which are suitable for those 3D memory architectures in which the array device and the peripheral device formed on different substrates are formed sequentially or joined by hybrid bonding in a face-to-face manner. In some embodiments, the TACs in the through array contact structures disclosed herein are formed through a stack of alternating dielectric layers, which can be more easily etched to form through holes therein compared with a stack of alternating conductor and dielectric layers, thereby reducing the process complexity and manufacturing cost.

FIG. 1 illustrates a schematic diagram of an exemplary 3D memory device 100 in a plan view, according to some embodiments of the present disclosure. 3D memory device 100 can include a plurality of channel structure regions (e.g., memory planes, memory blocks, memory fingers, etc., which are described in detail in connection with various figures below), while one or more TAC structures can be formed between two neighboring channel structure regions (e.g., two channel structure regions next to each other).

As shown in FIG. 1, 3D memory device 100 can include four or more memory planes 110, each of which can include a plurality of memory blocks 115. It is noted that, the arrangement of memory planes 110 in 3D memory device 100 and the arrangement of memory blocks 115 in each memory plane 110 illustrated in FIG. 1 are only used as an example, which is not limit the scope of the present disclosure.

TAC structures can include one or more bitline (BL) TAC regions 160 that are sandwiched by two neighboring memory blocks 115 in the bitline direction of the 3D memory device (labeled as "BL" in figures) and extended along the wordline direction of the 3D memory device (labeled as "WL" in figures), one or more wordline (WL) TAC regions 170 that are sandwiched by two neighboring memory blocks 115 in the wordline direction (WL) and extended along the bitline direction (BL), and one or more staircase structure (SS) TAC regions 180 that are located at the edges of each memory plane 110.

In some embodiments, 3D memory device 100 can include a plurality of contact pads 120 arranged in a line at an edge of the 3D memory device 100. Contact pads 120 can be used for electrically interconnecting 3D memory device 100, for example, metal interconnections, to any suitable device and/or interface that can provide driving power, receive control signals, transmit response signals, etc.

Figure 2:
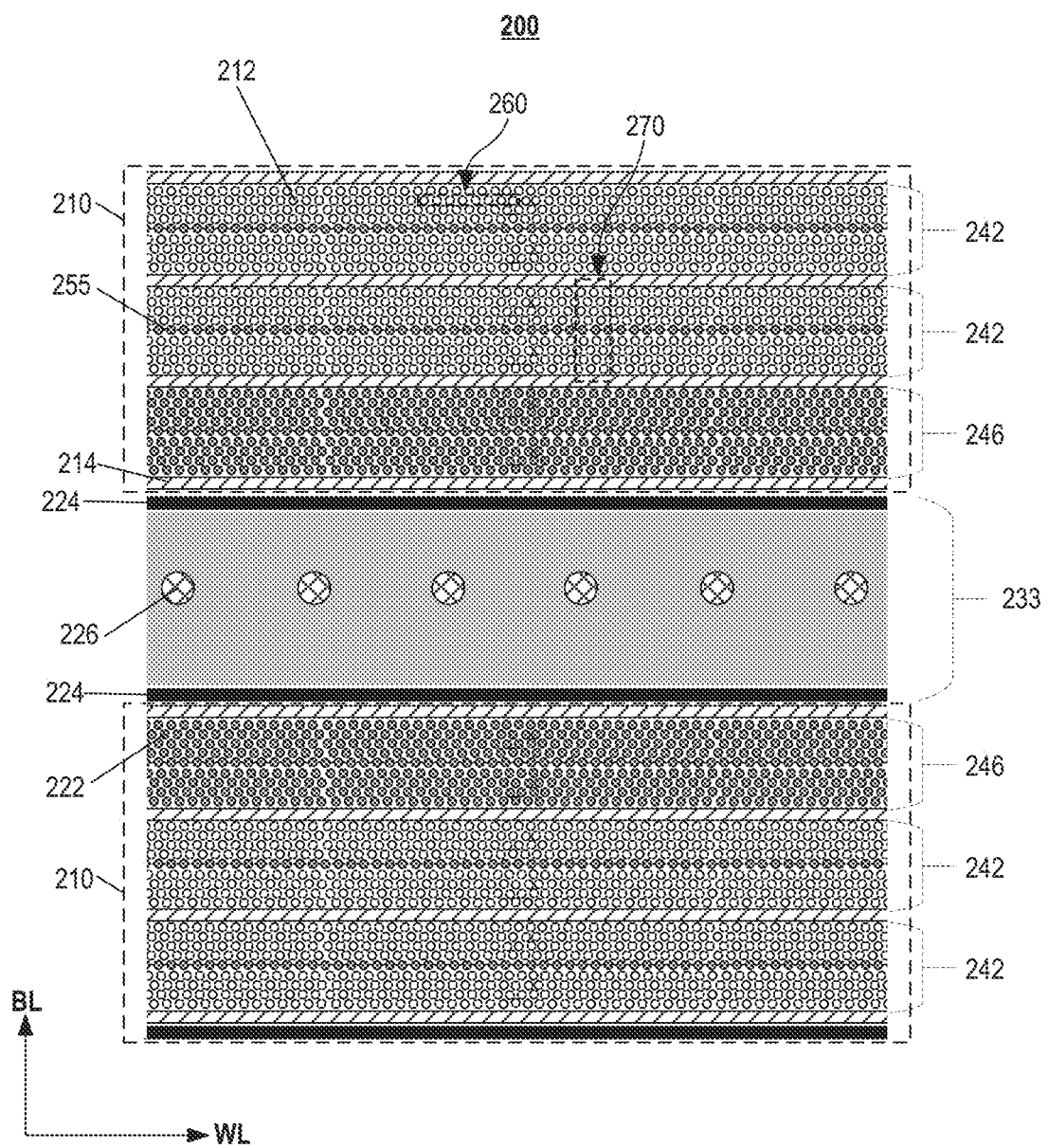
FIG. 2 illustrates a schematic enlarged plan view of a region of 3D memory device including an exemplary bitline through array contact region, according to some embodiments of the present disclosure.

FIG. 2 depicts an enlarged plan view of a region 130 shown in FIG. 1 including an exemplary bitline (BL) TAC region 160 of the 3D memory device 100.

Referring to FIG. 2, an enlarged plan view of the region 130 shown in FIG. 1 including an exemplary bitline (BL) TAC region of the 3D memory device 100 is illustrated, according to some embodiments of the present disclosure. The region 200 of the 3D memory device 100 (i.e., region 130 as shown in FIG. 1) can include two channel structure regions 210 (e.g., neighboring memory blocks 115 in BL direction) and a bitline (BL) TAC region 233 (e.g., BL TAC region 160 as shown in FIG. 1).

Channel structure regions 210 can include an array of channel structures 212, each being part of a NAND string including a plurality of stacked memory cells. Channel structures 212 extend through a plurality of conductive layer and dielectric layer pairs that are arranged along a direction that is perpendicular to the plan view, which is also referred as a direction that is perpendicular to the surface of the substrate of the 3D memory device, and/or a "vertical direction" (which is illustrated in a cross-sectional view in connection with FIGS. 5A-5B described in detail below).

The plurality of conductor/dielectric layer pairs are also referred to herein as an "alternating conductor/dielectric stack." The number of the conductor/dielectric layer pairs in alternating conductor/dielectric stack (e.g., 32, 64, or 96) can set the number of memory cells in 3D memory device 100. Conductive layers and dielectric layers in alternating conductor/dielectric stack alternate in the vertical direction. In other words, except layer pairs at the top or bottom of alternating conductor/dielectric stack, each conductive layer can be adjoined by two dielectric layers on both sides, and each dielectric layer can be adjoined by two conductive layers on both sides.

Conductive layers can include conductive materials including, but not limited to, tungsten (W), cobalt (Co), copper (Cu), aluminum (Al), polycrystalline silicon (polysilicon), doped silicon, silicides, or any combination thereof. Dielectric layers can include dielectric materials including, but not limited to, silicon oxide, silicon nitride, silicon oxynitride, or any combination thereof. In some embodiments, conductive layers include metal layers, such as W, and dielectric layers include silicon oxide.

In some embodiments, BL TAC region 233 can be sandwiched by two neighboring channel structure regions 210 in BL direction and can extend in WL direction. TAC region 233 can be defined by a barrier structure 224 in conjunction with the edges of BL TAC region 233 of 3D memory device 100. Multiple TACs 226 can be formed in BL TAC region 233, which is enclosed laterally by barrier structure 224 and the edges of BL TAC region 233. In some embodiments, multiple TACs 226 in BL TAC region 233 can penetrate an alternating dielectric stack for switch routing and for reducing bitline capacitance.

The alternating dielectric stack can include a plurality of dielectric layer pairs that are arranged along the vertical direction that is perpendicular to the surface of the substrate of the 3D memory device (which is illustrated in a cross-sectional view in connection with FIGS. 5A-5B described in detail below). Each dielectric layer pair includes a first dielectric layer and a second dielectric layer that is different from first dielectric layer. In some embodiments, first dielectric layer and second dielectric layer each includes silicon nitride and silicon oxide. First dielectric layers in alternating dielectric stack can be the same as dielectric layers in the alternating conductor/dielectric stack described above. In some embodiments, the number of dielectric layer pairs in the alternating dielectric stack is the same as the number of the conductor/dielectric layer pairs in the alternating conductor/dielectric stack.

As shown in FIG. 2, each channel structure region 210 can include one or more slit structures 214 each extending along WL direction. At least some slit structures 214 can function as a common source contact for an array of channel structures 212 in channel structure regions 210. Slit structures 214 can also divide 3D memory device 100 into multiple memory fingers 242 and/or dummy memory fingers 246. A top select gate cut 255 can be disposed along a centerline of each memory finger 242 along WL direction to divide a top select gate (TSG) of memory finger 242 into two portions (e.g., two memory pages). The top select gate cut 255 can include dielectric materials including, but not limited to, silicon oxide, silicon nitride, silicon oxynitride, or any combination thereof.

In some embodiments, dummy channel structures 222 can be formed in part of channel structure regions 210, for example, in dummy memory fingers 246 that are adjacent to BL TAC region 233 along BL direction. Dummy channel structures 222 can provide mechanical support for the memory array structures. Dummy memory fingers 246 do not have memory functions and, thus, bitlines and related interconnection lines are not formed in dummy memory fingers 246.

Figure 3:
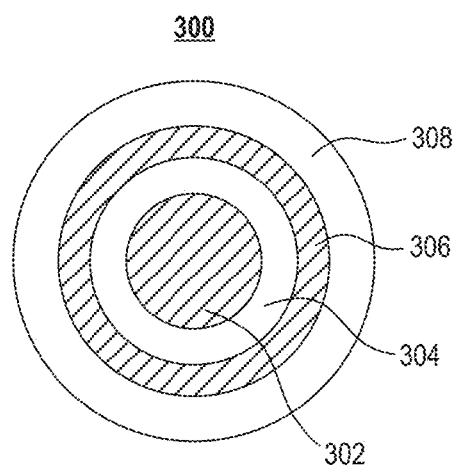
FIG. 3 illustrates a schematic plan view of an exemplary channel hole, according to some embodiments of the present disclosure.

Referring to FIG. 3, a schematic plan view of a channel structure 212 shown in FIG. 2 is illustrated, according to some embodiments of the present disclosure.

As shown in FIG. 3, channel hole 300 (i.e., channel structure 212 as shown in FIG. 2) can include a channel 302, a first insulating layer 304, a charge trap layer 306, and a second insulating layer 308. Channel hole 300 is a filled hole or cylinder extending vertically through the alternating conductor/dielectric stack of 3D memory device 100 to form a vertical memory string of a plurality of memory cells, for example, a NAND memory string. Channel hole 300 can have an elliptical cross-section, for example, a circular cross-section. First insulating layer 304 is radially disposed between channel 302 and charge trap layer 306, and charge trap layer 306 is radially disposed between first insulating layer 304 and second insulating layer 308. Channel 302 is electrically connected to a bitline (BL) connection at one end of channel hole 300, which transfers charge (i.e., electrons) along channel 302. First insulating layer 304 functions as a tunneling layer for charge (i.e., electrons) along channel 302. Charge trap layer 306 functions as a charge trap layer to store charge (i.e., electrons). Second insulating layer 308 functions as a blocking layer or gate and is electrically connected to a plurality of wordline (WL) connections spaced vertically along channel hole 300. In some embodiments, channel hole 300 can be a plurality of vertical memory strings. In some embodiments, channel hole 300 can be a vertical memory string of a plurality of memory cells.

In some embodiments, channel 302 can include conductive materials. For example, channel 302 can include conductive materials including, but not limited to, tungsten (W), cobalt (Co), copper (Cu), aluminum (Al), polycrystalline silicon (polysilicon), doped silicon, silicides, or any combination thereof. In some embodiments, channel 302 can include conductive and insulating materials. For example, channel 302 can be polysilicon annular ring with an insulating (e.g., oxide) center extending along the length of channel hole 300. In some embodiments, first insulating layer 304 can be silicon oxide. In some embodiments, charge trap layer 306 can be silicon nitride. In some embodiments, second insulating layer 308 can be silicon oxide.

Figure 4:
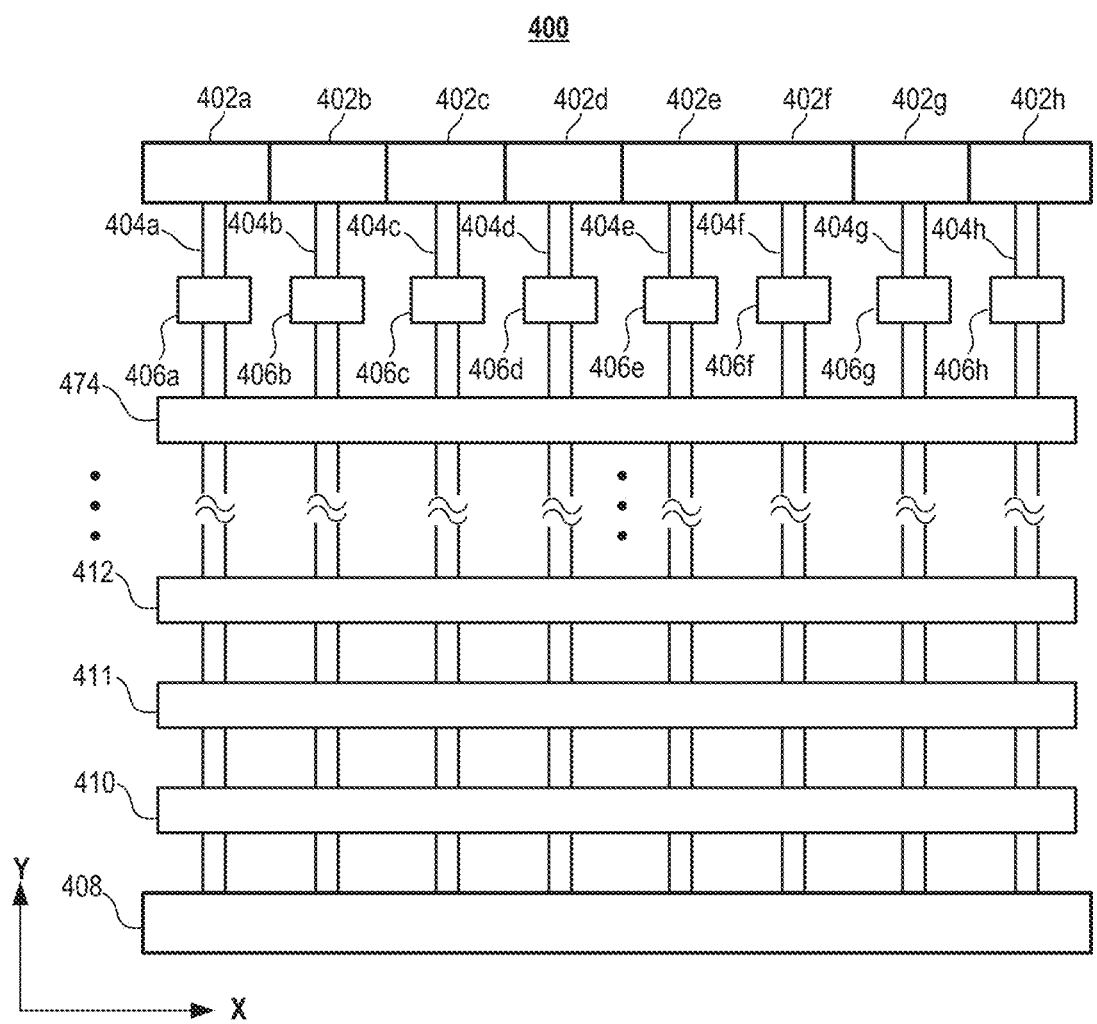
FIG. 4 illustrates a schematic cross-sectional diagram of an exemplary 3D memory device including a vertical string of memory cells, according to some embodiments of the present disclosure.

FIG. 4 depicts a schematic cross-sectional diagram of a region 260 shown in FIG. 2 including a plurality of channel structures 212 (i.e., channel hole 300 as shown in FIG. 3) along a Y-direction (e.g., vertical direction of 3D memory device 100) forming a vertical string of memory cells, according to some embodiments of the present disclosure. It is noted that X-direction (e.g., WL direction) and Y-direction axes are shown in FIG. 4 to illustrate the spatial relationship of the plurality of channel structures 212.

As shown in FIG. 4, region 400 of 3D memory device 100 (i.e., region 260 as shown in FIG. 2) can include a plurality of bitlines (BL) 402a-402h connected to a top end of a plurality of channel holes 404a-404h (i.e., eight parallel channel structures 212 of region 260 as shown in FIG. 2, e.g., channel hole 300 as shown in FIG. 3), respectively, to form a plurality of memory strings. The plurality of channel holes 404a-404h are each connected to a plurality of top select gates (TSG) 406a-406h, respectively, along the X-direction. The plurality of channel holes 404a-404h are each connected to a plurality of wordlines (WL) 410, 411, 412, . . . , 474. The plurality of wordlines (WL) 410, 411, 412, . . . , 474 each extend along the X-direction and are spaced vertically along the Y-direction and connect to the plurality of channel holes 404a-404h. As shown in FIG. 4, for example, 3D memory device 100 can include 64 layers. A bottom end of the plurality of channel holes 404a-404h can be connected to a ground select line (GSL) 408. In some embodiments, channel holes 404a-404h can each be a plurality of vertical memory strings. In some embodiments, channel holes 404a-404h can each be a vertical memory string of a plurality of memory cells.

Figure 5A:
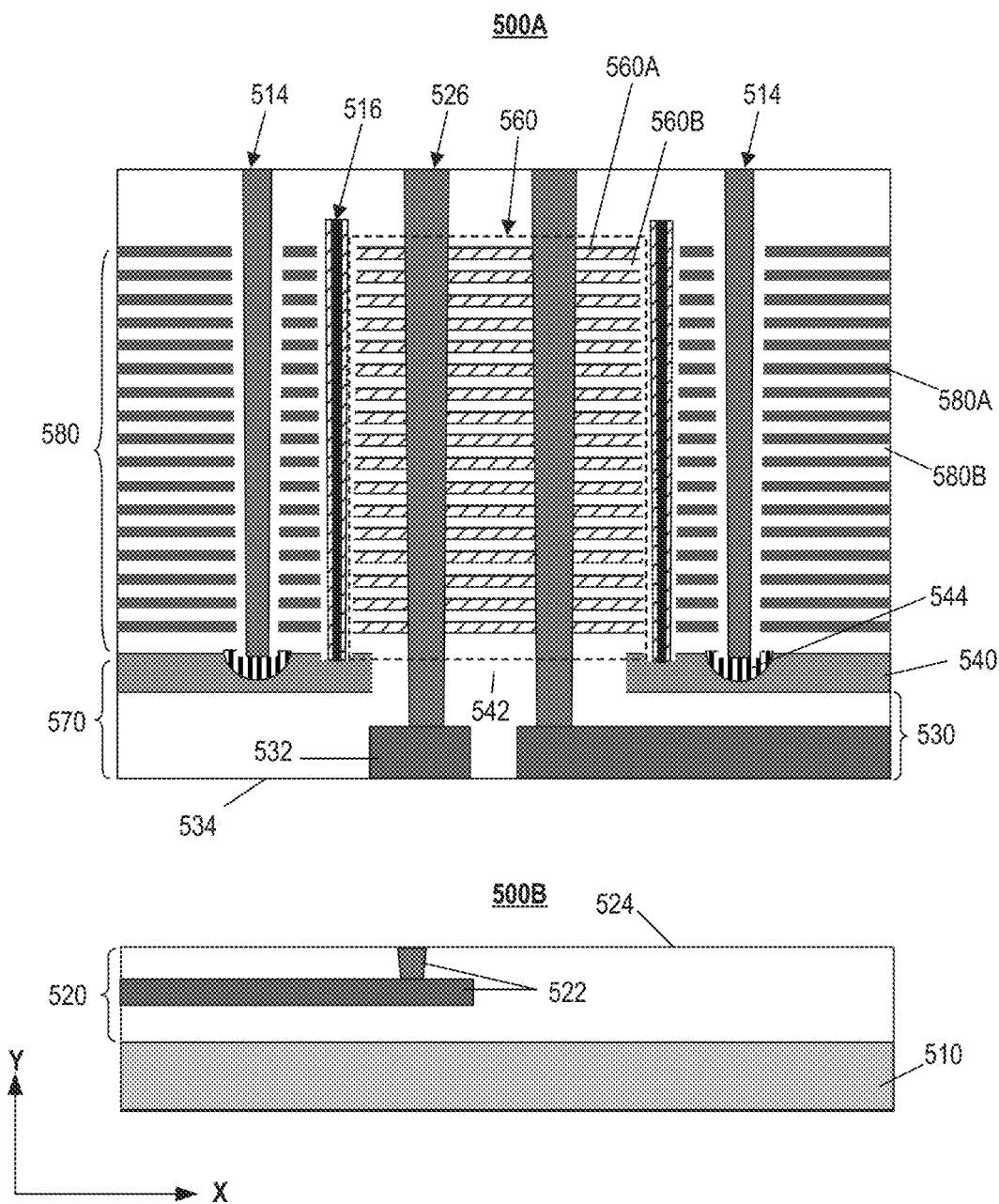
FIGS. 5A-5B illustrate schematic cross-sectional views of an exemplary 3D memory device at certain fabricating stages, according to some embodiments of the present disclosure.
Figure 5B:
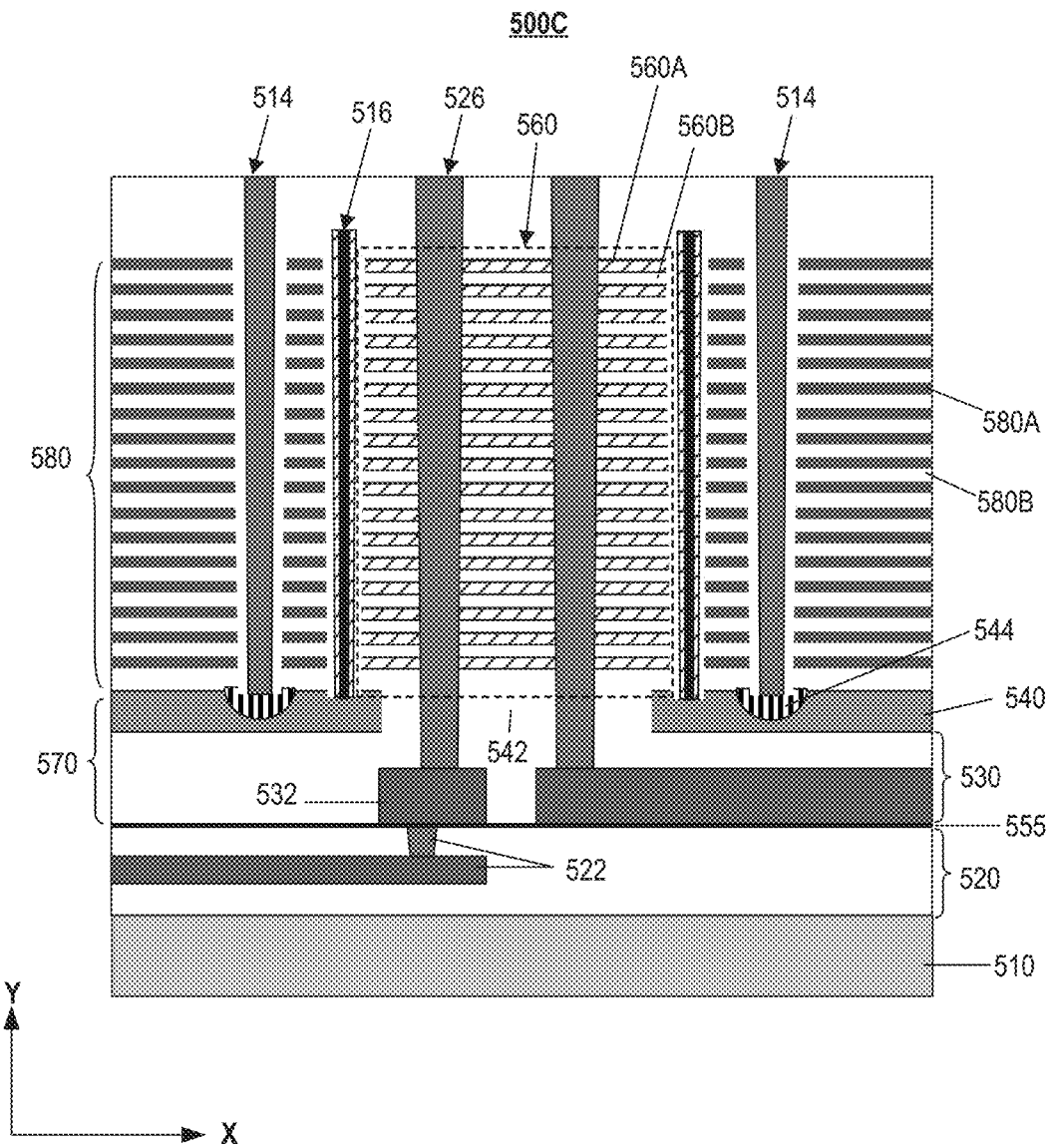

Referring to FIGS. 5A-5B, schematic cross-sectional views of an exemplary 3D memory device at certain fabricating stages are shown, according to some embodiments of the present disclosure. FIG. 5A illustrates two separate chips 500A, 500B before bonding, while FIG. 5B illustrates 3D memory device 500C that is formed by bonding first chip 500A and second chip 500B. It is noted that 3D memory device 500C shown in FIG. 5B can be part of a non-monolithic 3D memory device, in which components (e.g., the peripheral device and array device) can be formed separately on different substrates. For example, 3D memory device 500C can be region 130 described above in connection with FIG. 1.

As shown in FIG. 5A, first chip 500A can include a first substrate 570 and an array device above first substrate 570. It is noted that X-direction and Y-direction axes, similar to X-direction and Y-direction axes shown in FIG. 4, are shown in FIGS. 5A and 5B to further illustrate the spatial relationship of the components in chips 500A and 500B, as well as 3D memory device 500C. First substrate 570 includes a first bonding surface 534, which can be a lateral bottom surface extending laterally in the X-direction (the lateral direction, e.g., WL direction or BL direction).

As used herein, whether one component (e.g., a layer or a device) is "on," "above," or "below" another component (e.g., a layer or a device) of a semiconductor device (e.g., array device) is determined relative to the substrate of the semiconductor device (e.g., first substrate 570) in the Y-direction (i.e., vertical direction) when the substrate is positioned (or otherwise disposed) in the lowest plane of the semiconductor device in the Y-direction. The cross-sectional view of the 3D memory device shown in FIGS. 5A and 5B is along a plane in BL direction and Y-direction.

First substrate 570 can be used for supporting the array device, and can include an array interconnection layer 530 and a base substrate 540. Array interconnection layer 530 can be a back-end-of-line (BEOL) interconnection layer including one or more interconnection structures 532 embedded in a dielectric layer. Interconnection structures 532 can include, but are not limited to, contacts, single-layer/multi-layer vias, conductive lines, plugs, pads, and/or any other suitable conductive structures including, but not limited to, tungsten (W), cobalt (Co), copper (Cu), aluminum (Al), polycrystalline silicon (polysilicon), doped silicon, silicides, or any combination thereof. The dielectric layer can include dielectric materials including, but not limited to, silicon oxide, silicon nitride, silicon oxynitride, or any combination thereof. One or more portions of interconnection structures 532 can be exposed on the first bonding surface 534 of first substrate 570.

Base substrate 540 can include any suitable semiconductor including, but not limited to, silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, base substrate 540 is a thinned substrate (e.g., a semiconductor layer), which was thinned by grinding, wet/dry etching, chemical mechanical polishing (CMP), or any combination thereof. In some embodiments, base substrate 540 can be a single layer substrate or a multi-layer substrate, for example, a monocrystalline single-layer substrate, a polycrystalline silicon (polysilicon) single-layer substrate, a polysilicon and metal multi-layer substrate, etc.

Further, one or more openings 542 can be formed in regions of base substrate 540 that correspond to one or more through array contact (TAC) structures 526 of the array device. In some embodiments, a plurality of TACs 526 can extend through one or more openings 542 to electrically connect to one or more interconnection structures 532 in array interconnection layer 530. In some embodiments, a plurality of conductive plugs (not shown) penetrating through the one or more openings 542 can be used to electrically connect the plurality of TACs 526 to one or more interconnection structures 532 in array interconnection layer 530. In some embodiments, one or more openings 542 can be filled with dielectric material to insulate the plurality of TACs 526 and/or plurality of conductive plugs.

In some embodiments, array device can be a NAND flash memory device, in which memory cells are provided in the form of an array of channel structures (not shown in FIGS. 5A and 5B) extending along the Y-direction above first substrate 570. The array device can include a plurality of channel structures that extend through an alternating conductor/dielectric stack 580, including a plurality of conductive layer 580A and dielectric layer 580B pairs. The number of the conductor/dielectric layer pairs in alternating conductor/dielectric stack 580 (e.g., 32, 64, or 96) can define the number of memory cells in 3D memory device 500C.

Conductive layers 580A and dielectric layers 580B in alternating conductor/dielectric stack 580 alternate along the Y-direction. As shown in FIG. 5A, except a top or a bottom end layer of alternating conductor/dielectric stack 580, each conductive layer 580A can be adjoined vertically by two dielectric layers 580B (i.e., one above and one below conductive layer 580A), and each dielectric layer 580B can be adjoined vertically by two conductive layers 580A (i.e., one above and one below dielectric layer 580B). Conductive layers 580A can each have the same thickness or different thicknesses. Similarly, dielectric layers 580B can each have the same thickness or different thicknesses. Conductive layers 580A can include conductive materials including, but not limited to, tungsten (W), cobalt (Co), copper (Cu), aluminum (Al), polycrystalline silicon (polysilicon), doped silicon, silicides, or any combination thereof. Dielectric layers 580B can include dielectric materials including, but not limited to, silicon oxide, silicon nitride, silicon oxynitride, or any combination thereof. In some embodiments, conductive layers 580A include metal layers, such as W, and dielectric layers 580B include silicon oxide.

In some embodiments, the array device further includes slit structures 514. Each slit structure 514 can extend along the Y-direction through alternating conductor/dielectric stack 580. Slit structure 514 can also extend laterally (i.e., substantially parallel to the substrate) to separate alternating conductor/dielectric stack 580 into multiple blocks (e.g., memory block 115 as shown in FIG. 1 in plan view). Slit structure 514 can include a slit filled with conductive materials including, but not limited to, W, Co, Cu, Al, silicides, or any combination thereof. Slit structure 514 can further include a dielectric layer with any suitable dielectric materials between the filled conductive materials and alternating conductor/dielectric stack 580 to electrically insulate the filled conductive materials from surrounding conductive layers 580A in alternating conductor/dielectric stack 580. As a result, slit structures 514, similar to slit structure 214 as shown in FIG. 2, can separate 3D memory device 500A, 500B, 500C into multiple memory fingers (e.g., memory finger 242 as shown in FIG. 2 in plan view).

In some embodiments, slit structure 514 functions as the source contact for channel structures in the same memory finger that share the same array common source. Slit structure 514 can thus be referred to as a "common source contact" of multiple channel structures. In some embodiments, base substrate 540 includes a doped region 544 (including p-type or n-type dopants at a desired doping level), and a bottom end of slit structure 514 contacts doped region 544 of base substrate 540.

In some embodiments, an alternating dielectric stack 560 can be located in a region that is surrounded laterally by a barrier structure 516 on base substrate 540. Alternating dielectric stack 560 can include a plurality of dielectric layer pairs. For example, alternating dielectric stack 560 can be formed by an alternating stack of a first dielectric layer 560A and a second dielectric layer 560B that is different from first dielectric layer 560A. In some embodiments, first dielectric layer 560A includes silicon nitride and second dielectric layer 560B includes silicon oxide. In some embodiments, second dielectric layers 560B in alternating dielectric stack 560 can be the same as dielectric layers 580B in alternating conductor/dielectric stack 580. In some embodiments, the number of dielectric layer pairs in alternating dielectric stack 560 can be the same as the number of conductor/dielectric layer pairs in alternating conductor/dielectric stack 580.

In some embodiments, barrier structure 516 can extend along the Y-direction to separate laterally alternating conductor/dielectric stack 580 and alternating dielectric stack 560. For example, barrier structure 516 can be a boundary between alternating conductor/dielectric stack 580 and alternating dielectric stack 560. In some embodiments, alternating dielectric stack 560 can be enclosed laterally by at least barrier structure 516. In some embodiments, barrier structure 516 can form a closed shape (e.g., a rectangle, a square, a circle, etc.) in plan view to completely enclose alternating dielectric stack 560.

As shown in FIG. 5A, first chip 500A further includes a plurality of TACs 526 each extending along the Y-direction through alternating dielectric stack 560. TACs 526 can be formed only inside the area enclosed laterally by at least barrier structure 516, which includes a plurality of dielectric layer pairs. For example, TACs 526 can extend vertically through dielectric layers (e.g., first dielectric layers 560A and second dielectric layers 560B), but not through any conductive layers (e.g., conductive layers 580A). Each TAC 526 can extend through the entire thickness of alternating dielectric stack 560, (e.g., all the dielectric layer pairs along the Y-direction). In some embodiments, TACs 526 can extend through base substrate 540 through opening 542 and electrically contact interconnection structure 532.

In some embodiments, TACs 526 can carry electrical signals to and/or from the array device, for example, as part of a power bus with shortened interconnect routing. In some embodiments, TACs 526 can provide electrical connections between the array device and the peripheral devices (not shown in FIGS. 5A and 5B) through one or more interconnection structures 532. In some embodiments, TACs 526 can provide mechanical support to alternating dielectric stack 560. For example, each TAC 526 can include a vertical opening through alternating dielectric stack 560 that is filled with conductive materials, including, but not limited to, W, Co, Cu, Al, doped silicon, silicides, or any combination thereof.

Second chip 500B can include a second substrate 510 and a peripheral interconnection layer 520 on the second substrate 510. Second substrate 510 can include any suitable semiconductor including, but not limited to, silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. Second substrate 510 can be a single layer substrate or a multi-layer substrate, for example, a monocrystalline single-layer substrate, a polycrystalline silicon (polysilicon) single-layer substrate, a polysilicon and metal multi-layer substrate, etc. In some embodiments, second substrate 510 is a thinned substrate (e.g., a semiconductor layer), which was thinned by grinding, wet/dry etching, chemical mechanical polishing (CMP), or any combination thereof.

One or more peripheral circuits (not shown in FIGS. 5A and 5B) can be formed on the second substrate 510. The one or more peripheral circuits can include any suitable digital, analog, and/or mixed-signal peripheral circuits used for facilitating the operation of the 3D memory device. For example, the one or more peripheral circuits can include a page buffer, a decoder (e.g., a row decoder and a column decoder), a latch, a sense amplifier, a driver, a charge pump, a current or voltage reference, any active or passive components of the circuits (e.g., transistors, diodes, resistors, or capacitors), or any combination thereof. In some embodiments, the one or more peripheral circuits can be formed on second substrate 510 using complementary metal-oxide-semiconductor (CMOS) technology (also known as a "CMOS chip").

In some embodiments, peripheral interconnection layer 520 can include one or more interconnection structures 522 embedded in a dielectric layer for electrically connecting the one or more peripheral circuits to the array device above the first substrate 570. The one or more interconnection structures 522 can include any suitable conductive structures including, but not limited to, contacts, single-layer/multi-layer vias, conductive layer(s), plugs, pads, and/or any other suitable conductive structures that are made by conductive materials including, but not limited to, W, Co, Cu, Al, doped silicon, silicides, or any combination thereof. Dielectric layer of peripheral interconnection layer 520 can have a single-layer structure or a multi-layer structure and include dielectric materials including, but not limited to, silicon oxide, silicon nitride, silicon oxynitride, doped silicon oxide, or any combination thereof.

Second chip 500B can include a second bonding surface 524, which can be a lateral top surface extending laterally along the X-direction (the lateral direction, e.g., WL direction or BL direction). In some embodiments, first bonding surface 534 of first chip 500A is bonded to second bounding surface 524 of second chip 500B. For example, peripheral interconnection layer 520 and array interconnection layer 530 can be bonded in a face-to-face manner. As shown in FIG. 5B, first chip 500A and second chip 500B can be bonded at bonding interface 555 to form 3D memory device 500C.

In some embodiments, bonding interface 555 is between peripheral interconnection layer 520 and array interconnection layer 530. For example, bonding interface 555 can be between two dielectric layers, such as a silicon nitride layer and a silicon oxide layer. For example, bonding interface 555 can be between two conductive layers, such as two metal (e.g., Cu) layers. In some embodiments, the bonding interface includes both the interface between dielectric layers and the interface between conductive layers. In some embodiments, one or more interconnection structures 532 in first chip 500A and one or more interconnection structures 522 in second chip 500B can be contacted with each other at bonding interface 555 for electrically interconnecting one or more TACs 526 in first chip 500A and the peripheral circuits in second chip 500B.

Bonding interface 555 can be formed by chemical bonds between the dielectric layers and/or the conductive layers on both sides of the bonding interface, e.g. first bonding surface 534 and second bonding surface 524 as shown in FIG. 5A. Bonding interface 555 can be formed by physical interaction (e.g., inter-diffusion) between the dielectric layers and/or the conductive layers on both sides of the bonding interface. In some embodiments, the bonding interface is formed after a plasma treatment or a thermal treatment of the surfaces from both sides of the bonding interface prior to the bonding process.

By using the bonding through contact hole on the back side of the first substrate, a pad layer of the interconnection structures can be formed on the back surface of the first substrate corresponding to the array device. Since the pad layer is formed on the back surface of the first substrate rather than the surrounding regions of the first substrate, the size of the 3D memory device can be reduced and the integration degree of the 3D memory device can be increased.

Figure 6A:
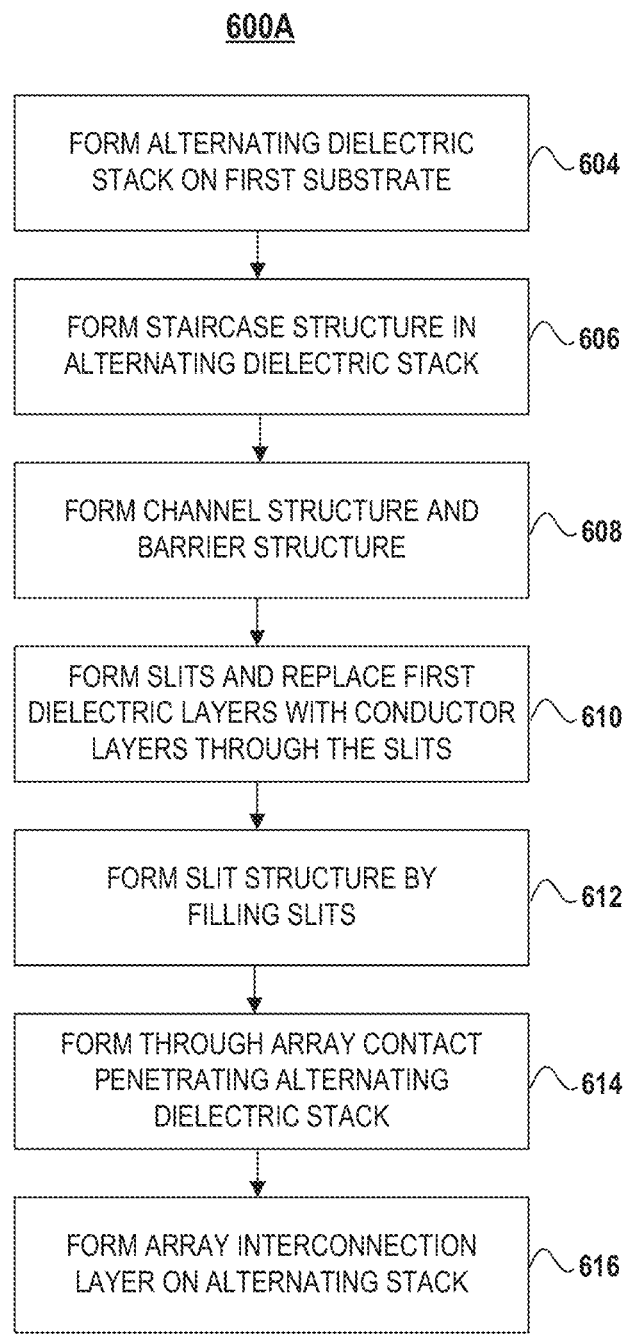
FIGS. 6A-6B are flowcharts of an exemplary method for forming an exemplary 3D memory device, according to some embodiments of the present disclosure.
Figure 6B:
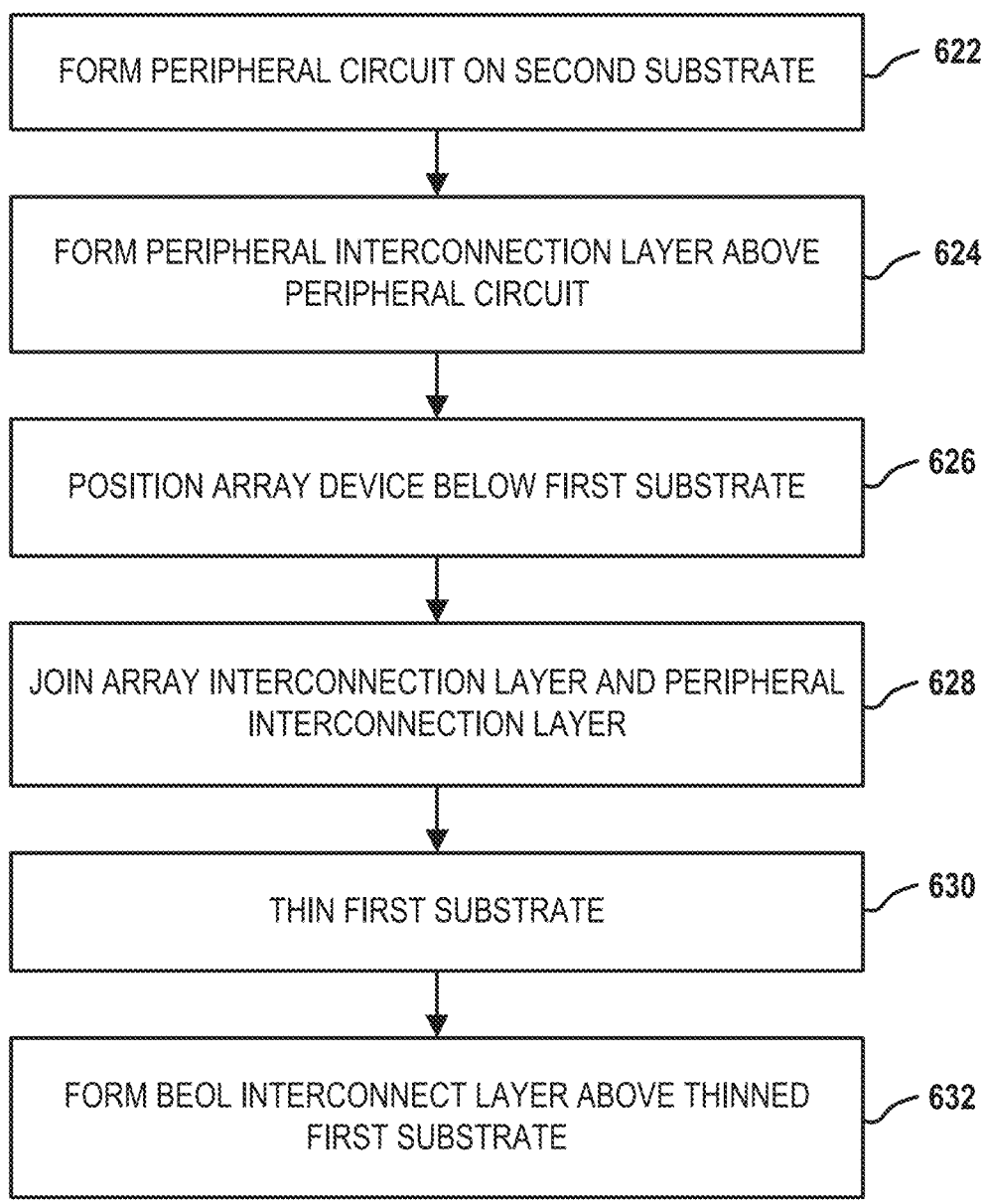

Referring to FIGS. 6A-6B, schematic flowcharts of an exemplary method for forming a 3D memory device are illustrated, according to some embodiments of the present disclosure. It should be understood that the operations shown in FIGS. 6A-6B are not exhaustive and that other operations can be performed as well before, after, or between any of the illustrated operations.

Referring to FIG. 6A, a flowchart of an exemplary method 600A for forming an array device and an array interconnection layer is illustrated, according to some embodiments. As shown in FIG. 6A, method 600A starts at operation 604, in which an alternating dielectric stack is formed on a first substrate. In some embodiments, the first substrate can be any suitable semiconductor substrate having any suitable structure, such as a monocrystalline single-layer substrate, a polycrystalline silicon (polysilicon) single-layer substrate, a polysilicon and metal multi-layer substrate, etc.

A plurality of dielectric layer pairs (also referred to herein as an "alternating dielectric stack") can be formed on the first substrate. The alternating dielectric stack can include an alternating stack of a first dielectric layer and a second dielectric layer that is different from first dielectric layer. In some embodiments, each dielectric layer pair includes a layer of silicon nitride and a layer of silicon oxide. In some embodiments, there are more layers than the dielectric layer pairs made of different materials and with different thicknesses in alternating dielectric stack. The alternating dielectric stack can be formed by one or more thin film deposition processes including, but not limited to, chemical vapor deposition (CVD), physical vapor deposition (PVD), atomic layer deposition (ALD), or any combination thereof.

Method 600A proceeds to operation 606, in which a staircase structure is formed at one or more edges of the alternating dielectric stack. In some embodiments, a trim-etch process can be performed on at least one side (in the lateral direction) of alternating dielectric stack to form the staircase structure with multiple levels. Each level can include one or more dielectric layer pairs with alternating first dielectric layer and second dielectric layer.

Method 600A proceeds to operation 608, in which a plurality of channel structures and one or more barrier structures are formed. Each channel structure and each barrier structure can extend vertically through the alternating dielectric stack.

In some embodiments, fabrication processes to form the channel structures include forming a channel hole that extends vertically through the alternating dielectric stack by, for example, wet etching and/or dry etching. In some embodiments, fabrication processes to form the channel structures further include forming a semiconductor channel and a memory film between the semiconductor channel and the dielectric layer pairs in the alternating dielectric stack. The semiconductor channel can include semiconductor materials, such as polysilicon. The memory film can be a composite dielectric layer, such as a combination of a tunneling layer, a storage layer, and a blocking layer.

The tunneling layer can include dielectric materials including, but not limited to, silicon oxide, silicon nitride, silicon oxynitride, or any combination thereof. Electrons or holes from the semiconductor channel can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer, such as an aluminum oxide ($Al_2O_3$) layer. Semiconductor channel and memory film can be formed by one or more thin film deposition processes, such as ALD, CVD, PVD, any other suitable processes, or any combination thereof.

In some embodiments, fabrication processes to form barrier structures are similarly and simultaneously performed as the fabrication processes to form channel structures, thereby reducing fabrication complexity and cost. In some other embodiments, channel structures and barrier structures are formed in different fabrication steps so that barrier structures can be filled with materials different from the materials filling channel structures.

In some embodiments, fabrication processes to form a barrier structure include forming a trench that extends vertically through alternating dielectric stack by, for example, wet etching and/or dry etching. After the trench is formed through the alternating dielectric stack, one or more thin film deposition processes can be performed to fill the trench with dielectric materials including, but not limited to, silicon oxide, silicon nitride, silicon oxynitride, silicon oxide/silicon nitride/silicon oxide (ONO), aluminum oxide ($Al_2O_3$), or any combination thereof.

By forming the one or more barrier structures, the alternating dielectric stack can be separated into two types of regions: one or more inside regions each enclosed laterally by at least a barrier structure (in conjunction with the edge(s) of alternating dielectric stack in some embodiments) and an outside region in which channel structures and/or word line contacts can be formed. It is noted that, each inside region corresponds to an opening in the first substrate.

In some embodiments, at least one inside region can be used to form a BL TAC structure as described above in connection with FIG. 2. As such, the barrier structure enclosing such inside region can include two parallel barrier walls that extend along WL direction.

In some embodiments, dummy channel structures can be formed simultaneously with channel structures. The dummy channel structures can extend vertically through the alternating layer stack and can be filled with the same materials as those in the channel structures. Different from the channel structures, contacts are not formed on the dummy channel structures to provide electrical connections with other components of the 3D memory device. Thus, the dummy channel structures are not used for forming memory cells in the 3D memory device.

Method 600A proceeds to operation 610, in which a plurality of slits are formed and first dielectric layers in a portion of the alternating dielectric stack are replaced with conductive layers through the plurality of slits. For example, multiple parallel slits extending in the WL direction can be first formed by wet etching and/or dry etching of dielectrics (e.g., silicon oxide and silicon nitride) through the alternating dielectric stack in the outside area. In some embodiments, doped regions can then be formed in the first substrate under each slit by, for example, ion implantation and/or thermal diffusion through the slits. It is understood that doped regions can be formed in an earlier fabrication stage, for example, prior to the formation of the slits, according to some embodiments.

In some embodiments, the formed slits are used for a gate replacement process (also known as the "word line replacement" process) that replaces, in the outside area of alternating dielectric stack, first dielectric layers (e.g., silicon nitride) with conductive layers (e.g., W). It is noted that the gate replacement occurs only in the outside area of the alternating dielectric stack, but not in the inside area, due to the formation of barrier structure. Barrier structure can prevent the etching of first dielectric layers (e.g., silicon nitride) in the inside area of alternating dielectric stack since barrier structure can be filled with materials immune to the etching step of the gate replacement process.

As a result, after the gate replacement process, the alternating dielectric stack in the outside region becomes the alternating conductor/dielectric stack. The replacement of first dielectric layers with conductive layers can be performed by wet etching first dielectric layers (e.g., silicon nitride) selective to second dielectric layers (e.g., silicon oxide) and filling the structure with conductive layers (e.g., W). Conductive layers can be filled by PVD, CVD, ALD, any other suitable process, or any combination thereof. Conductive layers can include conductive materials including, but not limited to, W, Co, Cu, Al, polysilicon, silicides, or any combination thereof. The formed alternating conductor/dielectric stack and remaining alternating dielectric stack can constitute an alternating stack.

Method 600A proceeds to operation 612, in which slit structures are formed by filling (e.g., depositing) conductive materials into the slits by PVD, CVD, ALD, any other suitable process, or any combination thereof. Slit structures can include conductive materials including, but not limited to, W, Co, Cu, Al, polysilicon, silicides, or any combination thereof. In some embodiments, a dielectric layer (e.g., a silicon oxide layer) is formed first between the conductive materials of slit structure and conductive layers surrounding slit structure in the alternating conductor/dielectric stack for insulation purposes. A lower end of slit structure can be in contact with a doped region.

Method 600A proceeds to operation 614, in which a plurality of TACs are formed through the alternating dielectric stack. TACs can be formed in the one or more inside regions by first etching vertical openings (e.g., by wet etching and/or dry etching), followed by filling the openings with conductive materials using ALD, CVD, PVD, any other suitable processes, or any combination thereof. The conductive materials used for filling the local contacts can include, but are not limited to, W, Co, Cu, Al, polysilicon, silicides, or any combination thereof. In some embodiments, other conductive materials are also used to fill the openings to function as a barrier layer, an adhesion layer, and/or a seed layer.

TACs can be formed by etching through the entire thickness of the alternating dielectric stack. Because the alternating dielectric stack includes alternating layers of dielectrics, such as silicon oxide and silicon nitride, the openings of TACs can be formed by deep etching of dielectric materials (e.g., by deep reactive-ion etching (DRIE) process or any other suitable anisotropic etch process). In some embodiments, although TACs are formed after the gate replacement, by reserving an area of the alternating dielectric stack that is not affected by the gate replacement process (not turned into alternating conductor/dielectric stack), TACs can be formed through dielectric layers (without passing through any conductive layers), which simplifies the fabrication process and reduces cost.

Method 600A proceeds to operation 616, in which an array interconnection layer is formed on the alternating stack. The array interconnection layer can be used to transfer electrical signals between the TACs and other parts of the 3D memory device, such as the peripheral circuits. In some embodiments, fabrication processes to form the array interconnection layer include forming a dielectric layer followed by forming a plurality of interconnection structures. One or more of the interconnection structures can be in contact with the TACs, respectively.

The dielectric layer can include one or more layers of dielectric materials including, but not limited to, silicon oxide, silicon nitride, silicon oxynitride, or any combination thereof. The interconnection structures can include, but are not limited to, contacts, single-layer/multi-layer vias, conductive lines, plugs, pads, and/or any other suitable conductive structures including, but not limited to, W, Co, Cu, Al, doped silicon, silicides, or any combination thereof.

In some embodiments, fabrication processes to form the interconnection structures include forming openings in the dielectric layer followed by filling the openings with conductive materials. The openings in the dielectric layer can be filled with conductive materials by ALD, CVD, PVD, any other suitable processes, or any combination thereof. In some embodiments, fabrication processes to form the interconnection structures further include forming one or more conductive layers and one or more contact layers in the dielectric layer. The conductive layers and the conductor contact layers can be formed by any suitable known BEOL methods.

Referring to FIG. 6B, a flowchart of an exemplary method 600B for forming a peripheral circuit and a peripheral interconnection layer is illustrated, according to some embodiments. As shown in FIG. 6B, method 600B starts at operation 622, in which a peripheral circuit is formed on a second substrate. In some embodiments, the second substrate can be any suitable semiconductor substrate having any suitable structure, such as a monocrystalline single-layer substrate, a polycrystalline silicon (polysilicon) single-layer substrate, a polysilicon and metal multi-layer substrate, etc.

The peripheral circuit can include any suitable peripheral device formed on the second substrate and any suitable interconnection circuits between the peripheral device. One or more peripheral devices and/or interconnection circuits can be formed by a plurality of processing steps including, but not limited to, photolithography, dry/wet etch, thin film deposition, thermal growth, implantation, CMP, or any combination thereof.

Method 600B proceeds to operation 624, in which a peripheral interconnection layer is formed on the peripheral circuit. The peripheral interconnection layer can include a dielectric layer above the peripheral circuit and one or more interconnection structures formed in the dielectric layer. The dielectric layer can include one or more layers of dielectric materials such as silicon oxide, silicon nitride, silicon oxynitride, or any combination thereof. The interconnection structures can include, but are not limited to, contacts, single-layer/multi-layer vias, conductive lines, plugs, pads, and/or any other suitable conductive structures including, but not limited to, W, Co, Cu, Al, doped silicon, silicides, or any combination thereof.

In some embodiments, the interconnection structures can be formed by using any suitable known middle-end-of-line (MEOL) method. For example, fabrication processes to form the interconnection structures can include forming openings in the dielectric layer followed by filling the openings with conductive materials. The openings in the dielectric layer can be filled with conductive materials by ALD, CVD, PVD, any other suitable processes, or any combination thereof. Further, fabrication processes to form the interconnection structures can include forming one or more conductive layers and one or more contact layers in the dielectric layer. The conductive layers and the contact layers can include conductor materials deposited by one or more thin film deposition processes including, but not limited to, CVD, PVD, ALD, electroplating, electroless plating, or any combination thereof. Fabrication processes to form the conductive layer and contact layers can include photolithography, CMP, wet/dry etch, or any combination thereof.

Method 600B proceeds to operation 626, in which the array device (and the array interconnection layer) is positioned (or otherwise disposed) below the first substrate (e.g., by flipping the first substrate upside down), and the array interconnection layer is aligned with the peripheral interconnection layer.

Method 600B proceeds to operation 628, in which the array interconnection layer is joined with the peripheral interconnection layer. The array interconnection layer can be joined with the peripheral interconnection layer by flip-chip bonding the first and second substrates. In some embodiments, the array interconnection layer and the peripheral interconnection layer are joined by hybrid bonding of the first substrate and the second substrate in a face-to-face manner, such that the array interconnection layer is above and in contact with the peripheral interconnection layer in the resulting 3D memory device.

Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously.

Method 600B proceeds to operation 630, in which the first substrate is thinned so that the thinned first substrate serves as a semiconductor layer above the array device (e.g., the NAND strings).

Method 600B proceeds to operation 632, in which a BEOL interconnection layer can be formed above the semiconductor layer.

Figure 7:
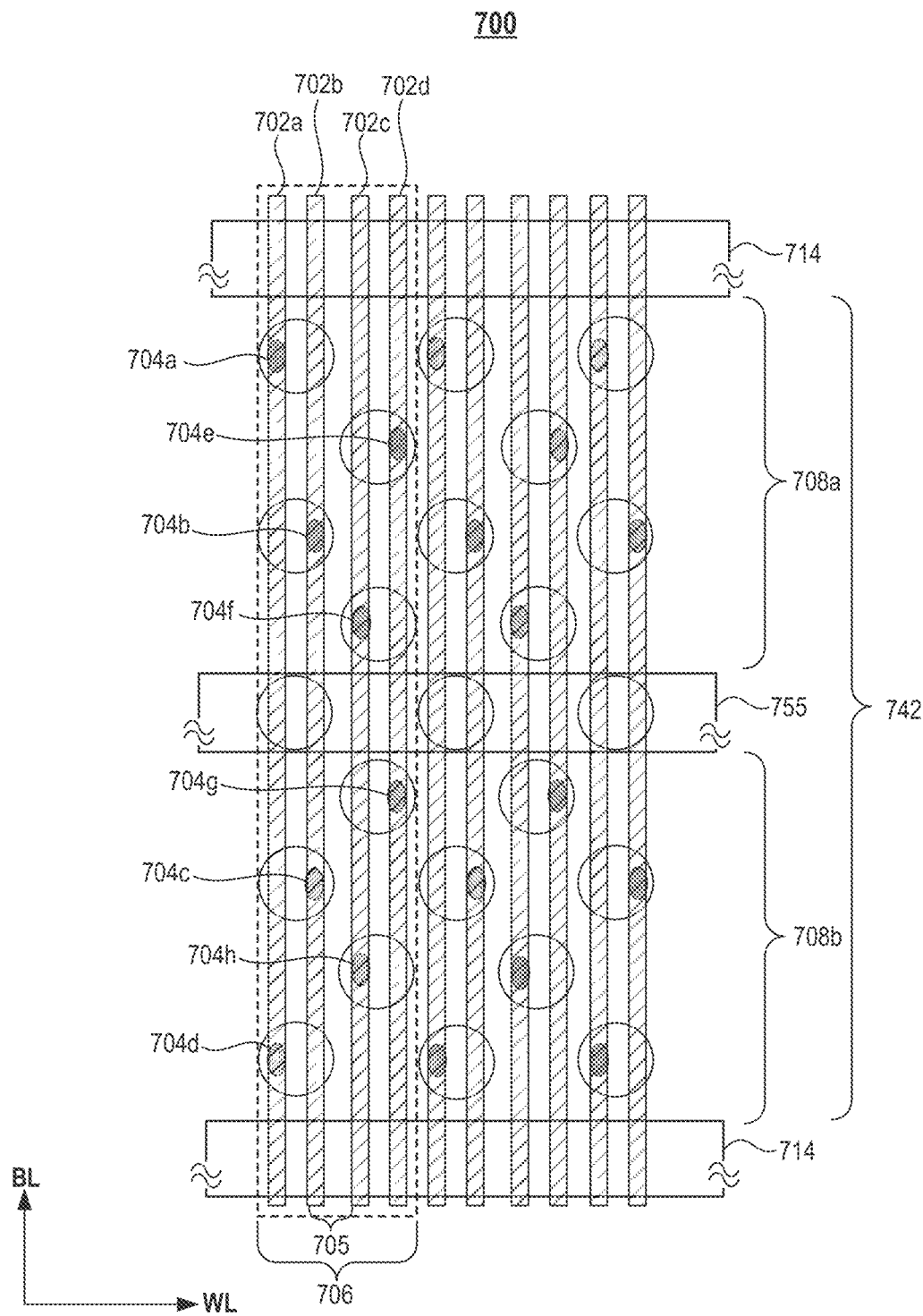
FIG. 7 illustrates a schematic enlarged plan view of a region of an exemplary 3D memory device, according to some embodiments of the present disclosure.

FIG. 7 depicts a schematic enlarged plan view of a region 270 shown in FIG. 2 including a portion of a memory finger 242 isolated by slit structures 214 and including a plurality of channel structures 212 (i.e., channel hole 300 as shown in FIG. 3) and a top select gate (TSG) cut 255, according to some embodiments of the present disclosure.

As shown in FIG. 7, region 700 of 3D memory device 100 (i.e., region 270 as shown in FIG. 2) can include a plurality of bitlines (BL) 702a-702d extending along the BL direction perpendicular to a memory finger 742 (i.e., memory finger 242 as shown in FIG. 2) and spaced horizontally along the WL direction. The plurality of bitlines (BL) 702a-702d are each connected to a top end of a plurality of channel holes 704a-704h (e.g., channel hole 300 as shown in FIG. 3), respectively, to form a plurality of memory strings. Each bitline 702a-702d can be connected to two channel holes 704a-704h, respectively. For example, first bitline 702a can be connected to channel holes 704a, 704d separated spatially by a top select gate (TSG) cut 755 (i.e., TSG cut 255 as shown in FIG. 2). In some embodiments, channel holes 704a-704h can each be a plurality of vertical memory strings. In some embodiments, channel holes 704a-704h can each be a vertical memory string of a plurality of memory cells.

Channel holes 704a-704h are arranged in vertical columns spaced along the WL direction. Channel hole pitch 706 includes a first vertical column of channel holes 704a-704d, a second vertical column of channel holes 704e-704h, and bitlines 702a-702d (i.e., four bitlines (BL)). Channel hole pitch 706 defines a horizontal distance (i.e., along the WL direction) of a repeating pattern of channel holes, for example, two columns of channel holes. Channel hole pitch 706 is defined or limited by a channel hole manufacturing process (e.g., photolithography process).

Memory finger 742 is isolated from adjacent memory fingers by slit structures 714 (i.e., slit structure 214 as shown in FIG. 2). Memory finger 742 can include a first memory page 708a and a second memory page 708b. First memory page 708a can include channel holes 704a, 704b, 704e, 704f. Second memory page 708b can include channel holes 704c, 704d, 704g, 704h. As shown in FIG. 7, a center row of channel holes can be cut through by top select gate (TSG) cut 755 (e.g., top three wordline (WL) layers) in order to individually select first or second memory pages 708a, 708b during write and read operations of 3D memory device 100. Memory finger 742 requires two reads to retrieve data from channel holes 704a-704h, since each bitline is connected to two channel holes.

Top select gate (TSG) cut 755 occupies a semiconducting (e.g., silicon) area of memory finger 742, but is not used for data storage. The use of top select gate (TSG) cut 755 increases the overall memory finger 742 size (i.e., along BL direction) and lowers the effective bit density of memory finger 742. Hence, top select gate (TSG) cut 755 increases memory block 115 size and 3D memory device 100 size. Further, overall memory page 708a, 708b size (i.e., along WL direction) is limited by bitline pitch 705, which is limited by channel hole pitch 706. As shown in FIG. 7, four bitlines 702a-702d are connected to four channel holes per page and, thus, bitline pitch 705 is 0.25 times channel hole pitch 706. A larger memory finger size typically requires longer wordline (WL) connections, which leads to larger wordline (WL) time constants and slower read and total programming times for 3D memory device 100.

Figure 8A:
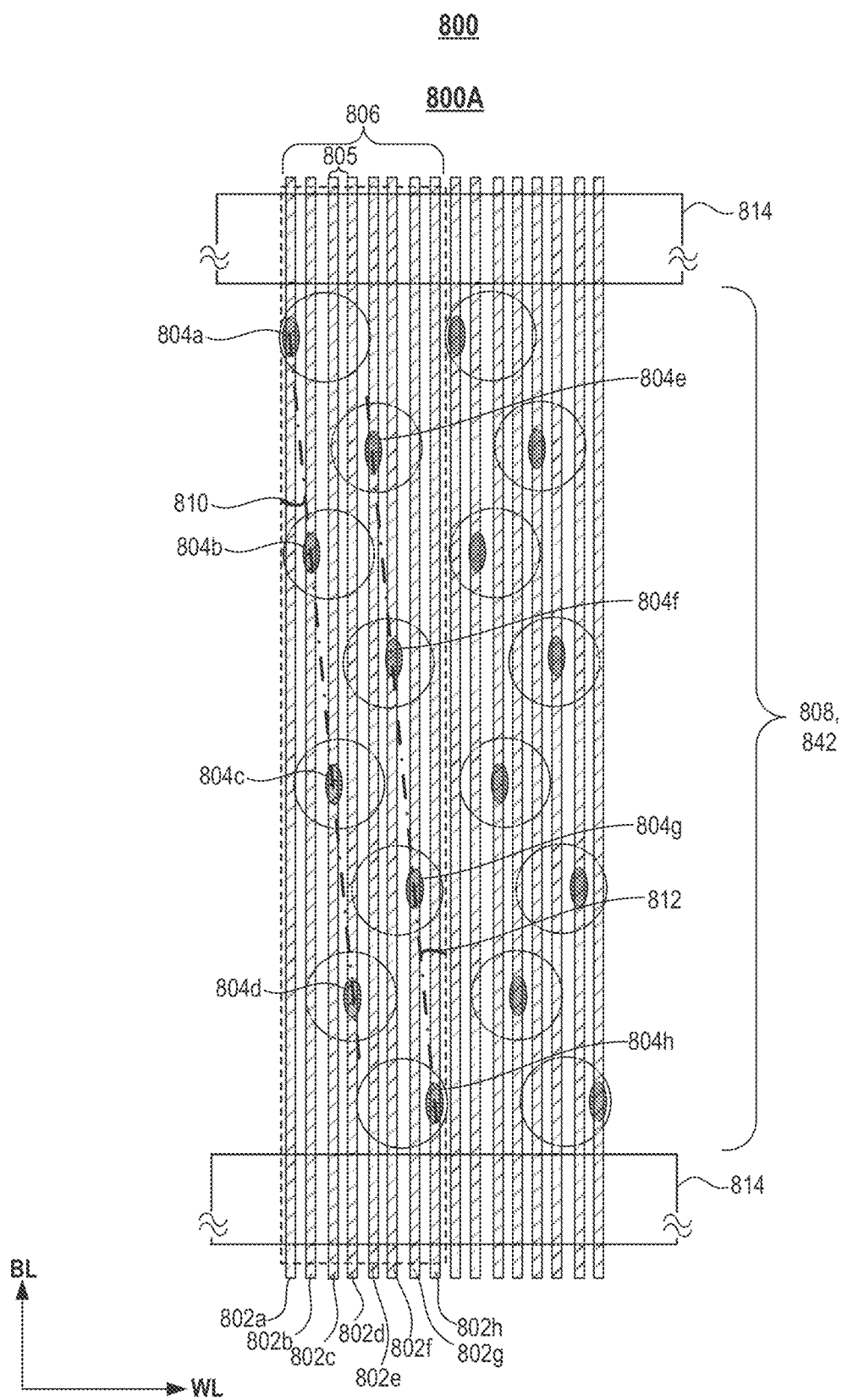
FIGS. 8A-8B illustrate schematic enlarged plan views of a region of an exemplary 3D memory device, according to some embodiments of the present disclosure.
Figure 8B:
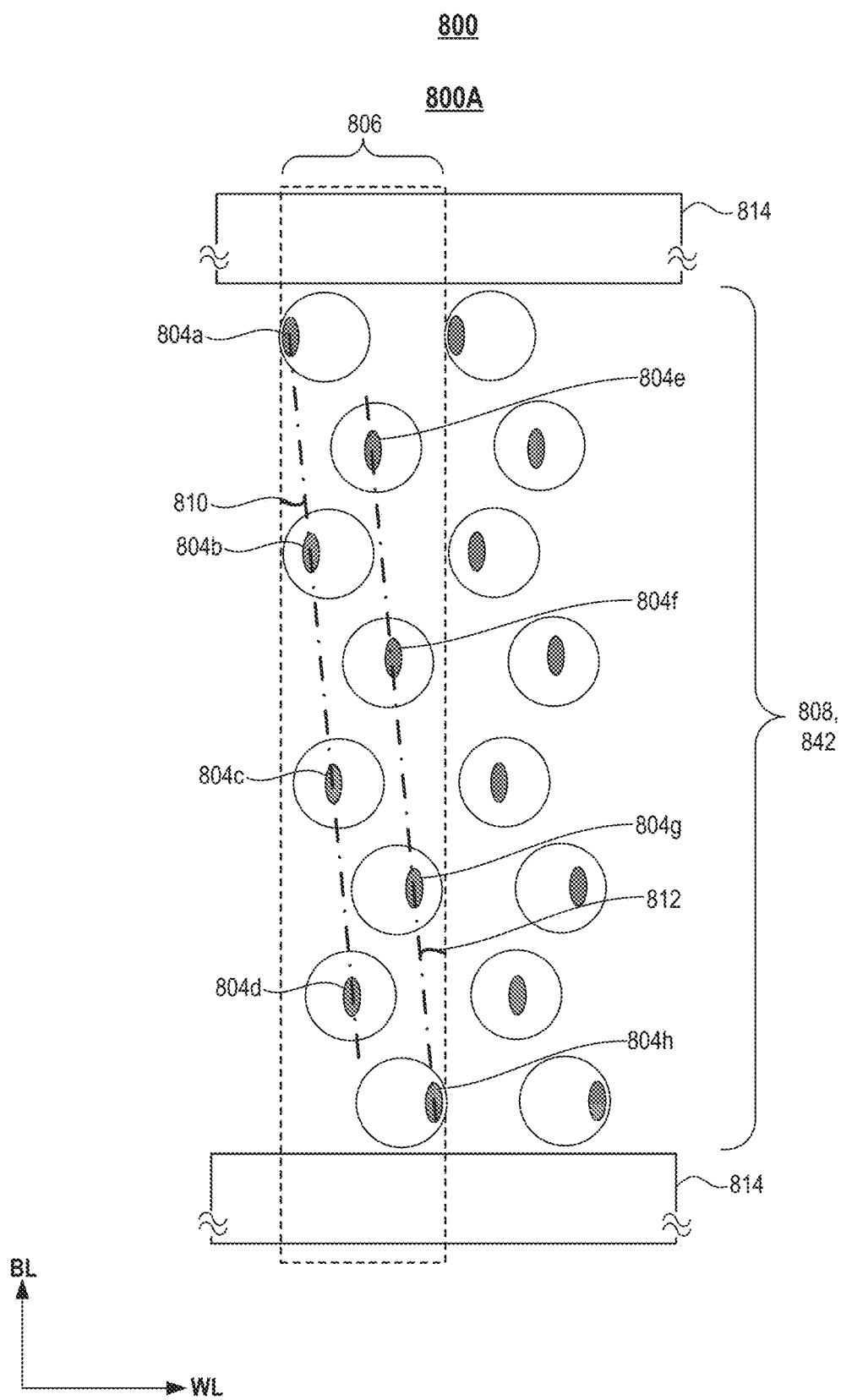
Figure 9:
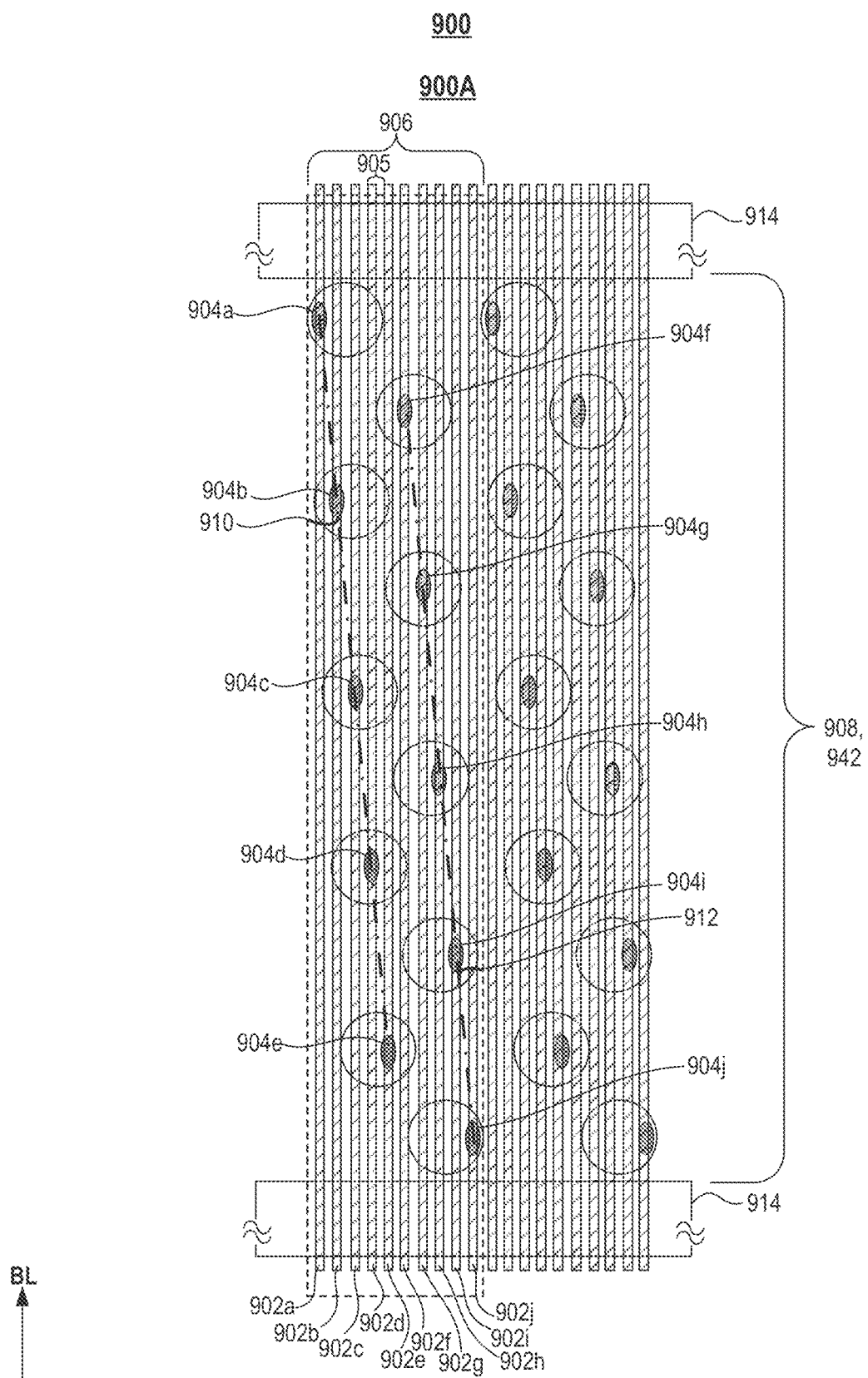
FIG. 9 illustrates a schematic enlarged plan view of a region of an exemplary 3D memory device, according to some embodiments of the present disclosure.

FIGS. 8A, 8B, and 9 illustrate schematic enlarged plan views of a region (e.g., region 270 shown in FIG. 2) of exemplary 3D memory devices, according to some embodiments of the present disclosure. FIGS. 8A, 8B, and 9 are similar to FIG. 7. FIGS. 8A, 8B, and 9 illustrate alternative embodiments of the memory architecture depicted in region 700 of FIG. 7 with a higher bit density, smaller channel hole pitch, and omitted top select gate (TSG) cut for larger memory page size, faster read and programming times, and smaller overall memory block and 3D memory device size.

As shown in FIG. 8A, a region 800A of exemplary 3D memory device 800 (i.e., similar to region 700 as shown in FIG. 7 for 3D memory device 100) can include a plurality of bitlines (BL) 802a-802h extending along the BL direction perpendicular to a memory finger 842 (i.e., similar to memory finger 742 as shown in FIG. 7) and spaced horizontally along the WL direction. FIG. 8B illustrates region 800A of 3D memory device 800 as shown in FIG. 8A with bitlines (BL) 802a-802h omitted for clarity.

As shown in FIGS. 8A-8B, 3D memory device 800 includes a plurality of channel holes 804a-804h spaced relative to each along the wordline (WL) direction. The plurality of bitlines (BL) 802a-802h are each connected to a top end of the plurality of channel holes 804a-804h, respectively, to form a plurality of memory strings. As shown in FIG. 8A, each bitline 802a-802h can be connected to an individual channel hole 804a-804h, respectively. For example, first bitline 802a can be connected to channel hole 804a, second bitline 802b can be connected to channel hole 804b, and so on. Top select gate (TSG) cut is omitted in 3D memory device 800, and all channel holes 804a-804h can be read with a single page read. In some embodiments, channel holes 804a-804h can each be a plurality of vertical memory strings. In some embodiments, channel holes 804a-804h can each be a vertical memory string of a plurality of memory cells.

In some embodiments, channel holes 804a-804h can be displaced evenly relative to each other along the wordline (WL) direction. In some embodiments, channel holes 804a-804h can be displaced evenly from each other by a relative distance of about 10 nm to 50 nm. For example, a center of channel hole 804a can be displaced from a center of channel hole 804b by about 10 nm to 50 nm. In some embodiments, channel holes 804a-804h can be displaced evenly from each other by a relative distance of about 1 nm to 10 nm. For example, a center of channel hole 804a can be displaced from a center of channel hole 804b by about 1 nm to 10 nm.

Channel holes 804a-804h are arranged in vertical columns spaced along the WL direction, with each vertical column angled relative to the BL direction. Channel hole pitch 806 includes a first column of channel holes 804a-804d, a second column of channel holes 804e-804h, first column angle 810, second column angle 812, and bitlines 802a-802h (i.e., eight bitlines (BL)). Each channel hole 804a-804h can be displaced evenly along the WL direction in order for each individual bitline 802a-802h to connect to each channel hole 804a-804h, respectively. In some embodiments, first column of channel holes 804a-804d can be angled to first column angle 810 relative to the BL direction, and second column of channel holes 804e-804h can be angled to second column angle 812 relative to the BL direction. For example, first and second column angles 810, 812 can be about 5 to about 30 degrees. For example, first and second column angles 810, 812 can be about 10 to about 15 degrees. In some embodiments, first and second column angles 810, 812 can be equal. In some embodiments, first and second column angles 810, 812 can be different.

Memory finger 842 is isolated from adjacent memory fingers by slit structures 814 (i.e., similar to slit structure 214 as shown in FIG. 2). Memory finger 842 can include memory page 808 with channel holes 804a-804h. As shown in FIG. 8B, TSG cut is omitted and as a result overall memory finger 842 size (i.e., along BL direction) is reduced, which increases the effective bit density of memory finger 842. Hence, memory page 808 size doubles (as compared to the memory architecture shown in FIG. 7), and overall memory block size and 3D memory device 800 size are reduced. Further, as shown in FIG. 8A, eight bitlines 802a-802h are connected to eight channel holes 804a-804h per page and, thus, bitline pitch 805 is 0.125 times channel hole pitch 806. The reduced bitline pitch 805 can be achieved by alignment manufacturing processes, for example, quadruple lithographic patterning. The displacement of channel holes 804a-804h also allows for a greater alignment margin between bitline 802a-802h and channel hole 804a-804h connections, respectively. 3D memory device 800 provides a larger memory page 808 size and bit density (i.e., one page read for eight channel holes due to individual bitline connections), smaller memory finger 842 size (i.e., due to omission of top select gate (TSG) cut), and faster read and programming times due to lower wordline (WL) time constants. TSG is continuous along the BL direction of memory page 808 of memory finger 842 between slit structures 814 and connects to channel holes 804a-804h.

Referring to FIG. 9, a region 900A of exemplary 3D memory device 900 (i.e., similar to region 700 as shown in FIG. 7 for 3D memory device 100) can include a plurality of bitlines (BL) 902a-902j extending along the BL direction perpendicular to a memory finger 942 (i.e., similar to memory finger 742 as shown in FIG. 7) and spaced horizontally along the WL direction.

As shown in FIG. 9, 3D memory device 900 includes a plurality of channel holes 904a-904j spaced relative to each along the WL direction. The plurality of bitlines (BL) 902a-902j are each connected to a top end of the plurality of channel holes 904a-904j, respectively, to form a plurality of memory strings. As shown in FIG. 9, each bitline 902a-902j can be connected to an individual channel hole 904a-904j, respectively. For example, first bitline 902a can be connected to channel hole 904a, second bitline 902b can be connected to channel hole 904b, and so on. Top select gate (TSG) cut is omitted in 3D memory device 900, and all channel holes 904a-904j can be read with a single page read. In some embodiments, channel holes 904a-904j can each be a plurality of vertical memory strings. In some embodiments, channel holes 904a-904j can each be a vertical memory string of a plurality of memory cells.

In some embodiments, channel holes 904a-904j can be displaced evenly relative to each other along the wordline (WL) direction. In some embodiments, channel holes 904a-904j can be displaced evenly from each other by a relative distance of about 10 nm to 50 nm. For example, a center of channel hole 904a can be displaced from a center of channel hole 904b by about 10 nm to 50 nm. In some embodiments, channel holes 904a-904j can be displaced evenly from each other by a relative distance of about 1 nm to 10 nm. For example, a center of channel hole 904a can be displaced from a center of channel hole 904b by about 1 nm to 10 nm.

Channel holes 904a-904j are arranged in vertical columns spaced along the WL direction, with each vertical column angled relative to the BL direction. Channel hole pitch 906 includes a first column of channel holes 904a-904e, a second column of channel holes 904f-904j, first column angle 910, second column angle 912, and bitlines 902a-902j (i.e., ten bitlines (BL)). Each channel hole 904a-904j can be displaced evenly along the WL direction in order for each individual bitline 902a-902j to connect to each channel hole 904a-904j, respectively. In some embodiments, first column of channel holes 904a-904e can be angled to first column angle 910 relative to the BL direction, and second column of channel holes 904e-904j can be angled to second column angle 912 relative to the BL direction. For example, first and second column angles 910, 912 can be about 5 to about 30 degrees. For example, first and second column angles 910, 912 can be about 10 to about 15 degrees. In some embodiments, first and second column angles 910, 912 can be equal. In some embodiments, first and second column angles 910, 912 can be different.

Memory finger 942 is isolated from adjacent memory fingers by slit structures 914 (i.e., similar to slit structure 214 as shown in FIG. 2). Memory finger 942 can include memory page 908 with channel holes 904a-904j. As shown in FIG. 9, TSG cut is omitted and as a result overall memory finger 942 size (i.e., along BL direction) is reduced, which increases the effective bit density of memory finger 942. Hence, memory page 908 size is increased by a factor of 2.5 (as compared to the memory architecture shown in FIG. 7), and overall memory block size and 3D memory device 900 size are reduced. Further, as shown in FIG. 9, ten bitlines 902a-902j are connected to ten channel holes 904a-904j per page and, thus, bitline pitch 905 is 0.1 times channel hole pitch 906. The reduced bitline pitch 905 can be achieved by alignment manufacturing processes, for example, quadruple lithographic patterning. The displacement of channel holes 904a-904j also allows for a greater alignment margin between bitline 902a-902j and channel hole 904a-904j connections, respectively. 3D memory device 900 provides a larger memory page 908 size and bit density (i.e., one page read for ten channel holes due to individual bitline connections), smaller memory finger 942 size (i.e., due to omission of top select gate (TSG) cut), and faster read and programming times due to lower wordline (WL) time constants. TSG is continuous along the BL direction of memory page 908 of memory finger 942 between slit structures 914 and connects to channel holes 904a-904j.

In some embodiments, memory finger 942 can include twelve bitlines 902 in channel hole pitch 906, with each bitline 902 connected to an individual channel hole 904. For example, memory page 908 size can be tripled (as compared to the memory architecture shown in FIG. 7), and twelve bitlines 902 can be connected to twelve channel holes 904 per page and, thus, bitline pitch 905 can be 0.083 times channel hole pitch 906.

Figure 10:
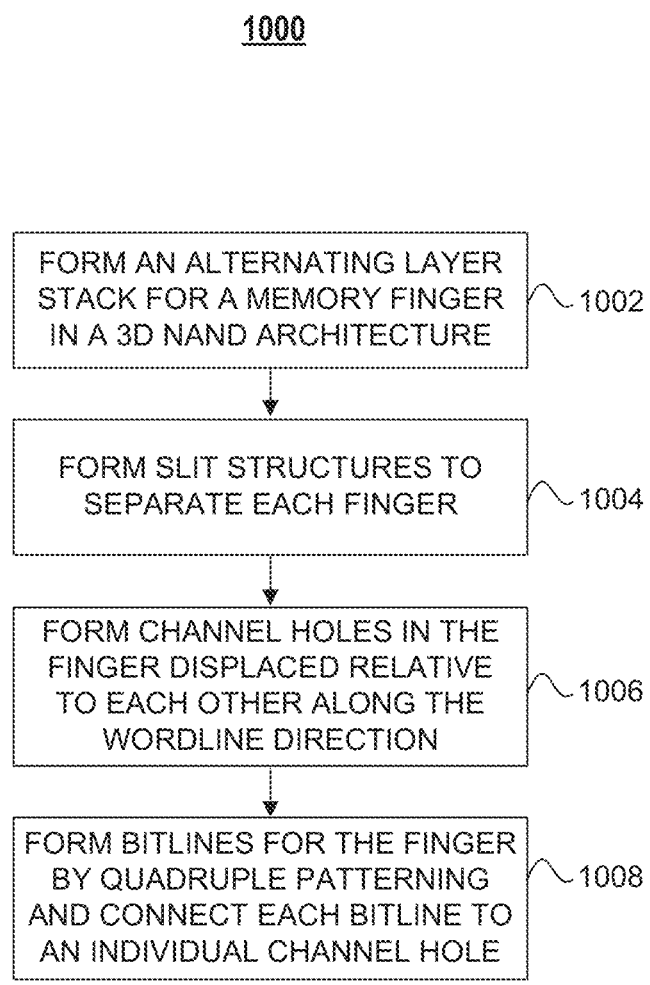
FIG. 10 is a flowchart of an exemplary method for forming an exemplary 3D memory device, according to some embodiments of the present disclosure.

Referring to FIG. 10, a schematic flowchart of an exemplary method for forming an exemplary memory finger for a 3D memory device is illustrated, according to some embodiments of the present disclosure. It should be understood that the operations shown in FIGS. 6A-6B are not exhaustive and that other operations can be performed as well before, after, or between any of the illustrated operations.

As shown in FIG. 10, method 1000 starts at operation 1002, in which an alternating layer stack is formed on a first substrate that includes an alternating conductor/dielectric stack including a plurality of conductor/dielectric pairs. The process is similar to that described in method 600A as shown in FIG. 6A. In some embodiments, the first substrate can be any suitable semiconductor substrate having any suitable structure, such as a monocrystalline single-layer substrate, a polycrystalline silicon (polysilicon) single-layer substrate, a polysilicon and metal multi-layer substrate, etc. A plurality of conductor/dielectric pairs (also referred to herein as an "alternating conductor/dielectric stack") can be formed on the first substrate. The alternating conductor/dielectric stack can be formed by one or more thin film deposition processes including, but not limited to, chemical vapor deposition (CVD), physical vapor deposition (PVD), atomic layer deposition (ALD), or any combination thereof.

Method 1000 proceeds to operation 1004, in which a plurality of slit structures are formed with each extending vertically through the alternating conductor/dielectric stack and laterally along a wordline direction to divide the alternating conductor/dielectric stack into at least one memory finger. The process is similar to that described in method 600A as shown in FIG. 6A.

Method 1000 proceeds to operation 1006, in which a first column of channel holes and a second column of channel holes are formed in the at least one memory finger. The process is similar to that described in method 600A as shown in FIG. 6A. However, the channel holes of the first and second columns are displaced relative to each other along the wordline direction. Each channel hole can extend through the alternating conductor/dielectric stack.

In some embodiments, channel holes can be displaced evenly relative to each other along the wordline direction. For example, channel holes can be displaced by a relative distance of about 1 nm to 10 nm. For example, channel holes can be displaced by a relative distance of about 10 nm to 50 nm.

In some embodiments, fabrication processes to form the channel holes include forming a channel hole that extends vertically through the alternating conductor/dielectric stack by, for example, wet etching and/or dry etching. In some embodiments, fabrication processes to form the channel holes further include forming a semiconductor channel and a memory film between the semiconductor channel and the conductor/dielectric pairs in the alternating conductor/dielectric stack. The semiconductor channel can include semiconductor materials, such as polysilicon. The memory film can be a composite dielectric layer, such as a combination of a tunneling layer, a storage layer, and a blocking layer. The tunneling layer can include dielectric materials including, but not limited to, silicon oxide, silicon nitride, silicon oxynitride, or any combination thereof. Electrons or holes from the semiconductor channel can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer, such as an aluminum oxide ($Al_2O_3$) layer. Semiconductor channel and memory film can be formed by one or more thin film deposition processes, such as ALD, CVD, PVD, any other suitable processes, or any combination thereof.

Method 1000 proceeds to operation 1008, in which a plurality of bitlines in the at least one memory finger are formed. Each bitline is connected to an individual channel hole. In some embodiments, the plurality of bitlines can be formed by a lithographic process. For example, the plurality of bitlines can be formed by quadruple patterning.

In some embodiments, the plurality of bitlines can be formed to have a bitline pitch that is 0.125 times the channel hole pitch. In some embodiments, the plurality of bitlines can be formed to have a bitline pitch that is 0.1 times the channel hole pitch. In some embodiments, the plurality of bitlines can be formed to have a bitline pitch that is 0.083 times the channel hole pitch.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a memory finger in a three-dimensional memory device, comprising:
   forming, on a substrate, an alternating layer stack;
   forming a plurality of slit structures each extending vertically through the alternating layer stack and laterally along a wordline direction to divide the alternating layer stack into at least one memory finger;
   forming, in the alternating layer stack, a plurality of conductor/dielectric layer pairs;
   forming a first column of vertical memory strings extending through the alternating layer stack in the at least one memory finger, wherein the vertical memory strings in the first column are displaced relative to each other along the wordline direction;
   forming a second column of vertical memory strings extending through the alternating layer stack in the at least one memory finger, wherein the vertical memory strings in the second column are displaced relative to each other along the wordline direction; and
   forming a plurality of bitlines displaced along the wordline direction and extending along a bitline direction in the at least one memory finger, wherein each bitline is connected to an individual vertical memory string in the first and second columns.

2. The method of claim 1, wherein forming the plurality of bitlines comprises quadruple patterning the plurality of bitlines.

3. The method of claim 1, wherein:
   forming the vertical memory strings of the first column comprises evenly displacing the vertical memory strings of the first column relative to each other along the wordline direction; and
   forming the vertical memory strings of the second column comprises evenly displacing the vertical memory strings of the second column relative to each other along the wordline direction.

4. The method of claim 3, wherein:
   the vertical memory strings of the first column are displaced relative to each other by a relative distance of about 1 nm to about 10 nm; and
   the vertical memory strings of the second column are displaced relative to each other by a relative distance of about 1 nm to about 10 nm.

5. The method of claim 1, further comprising forming a continuous top select gate along the bitline direction and connected to the first and second columns of vertical memory strings in the at least one memory finger.

6. The method of claim 1, wherein:
   forming the first column of vertical memory strings comprises forming the first column of vertical memory strings along a first angle relative to the bitline direction; and
   forming the second column of vertical memory strings comprises forming the second column of vertical memory strings along a second angle relative to the bitline direction.

7. The method of claim 6, wherein forming the first and second columns of vertical memory strings comprises arranging the first and second angles to be equal.

8. The method of claim 6, wherein forming the first and second columns of vertical memory strings comprises arranging the first and second angles to be different.

9. The method of claim 6, wherein:
   forming the first column of vertical memory strings comprises forming at least four vertical memory strings within the at least one memory finger and along the first angle; and
   forming the second column of vertical memory strings comprises forming at least four vertical memory strings within the at least one memory finger and along the second angle.

10. The method of claim 6, wherein forming the second column of vertical memory strings comprises offsetting the second column of vertical memory strings along the bitline direction relative to the first column of vertical memory strings, such that each vertical memory string of the second column of vertical memory strings is disposed between adjacent vertical memory strings of the first column of vertical memory strings along the bitline direction.

11. A method for forming a memory finger in a three-dimensional memory device, comprising:
    forming a first column of memory cells extending through an alternating layer stack, wherein the memory cells of the first column are displaced relative to each other along a wordline direction;
    forming a second column of memory cells extending through the alternating layer stack, wherein the memory cells in the second column are displaced relative to each other along the wordline direction; and
    forming a plurality of bitlines displaced along the wordline direction and extending along a bitline direction, wherein each bitline is connected to an individual memory cell in the first and second columns,
    wherein the first and second columns of memory cells are formed within a memory finger.

12. The method of claim 11, wherein forming the second column of memory cells comprises offsetting the second column of memory cells along the bitline direction relative to the first column of memory cells, such that each memory cell of the second column of memory cells is disposed between adjacent memory cells of the first column of memory cells along the bitline direction.

13. The method of claim 11, wherein:
forming the first and second columns of memory cells comprises defining a channel hole pitch along the wordline direction.

14. The method of claim 13, wherein forming the first and second columns of memory cells comprises arranging the channel hole pitch between the first and second columns of memory cells along the wordline direction to be less than 1.

15. The method of claim 11, wherein:
forming first and second columns of memory cells comprises defining a channel hole pitch along the wordline direction; and
forming the plurality of bitlines comprises defining a bitline pitch along the bitline direction.

16. The method of claim 15, wherein forming the first and second columns of memory cells and the plurality of bitlines comprises arranging the channel hole pitch to be greater than ten times the bitline pitch.

17. The method of claim 11, wherein:
forming the first column of memory cells comprises forming the first column of memory cells along a first angle relative to the bitline direction; and
forming the second column of memory cells comprises forming the second column of memory cells along a second angle relative to the bitline direction.

18. The method of claim 17, wherein:
forming the first column of memory cells comprises forming at least four memory cells within the memory finger and along the first angle; and
forming the second column of memory cells comprises forming at least four memory cells within the memory finger and along the second angle.

19. The method of claim 18, wherein:
forming the first column of memory cells comprises forming at least five memory cells within the memory finger and along the first angle; and
forming the second column of memory cells comprises forming at least five memory cells within the memory finger and along the second angle.

20. The method of claim 19, wherein:
forming the first column of memory cells comprises forming six memory cells within the memory finger and along the first angle; and
forming the second column of memory cells comprises forming six memory cells within the memory finger and along the second angle.

* * * * *